US008703019B2

(12) United States Patent
Hirosaki et al.

(10) Patent No.: US 8,703,019 B2
(45) Date of Patent: *Apr. 22, 2014

(54) PHOSPHOR AND USE THEREOF

(75) Inventors: Naoto Hirosaki, Tsukuba (JP); Takatoshi Seto, Yokohama (JP); Naoto Kijima, Yokohama (JP)

(73) Assignees: Mitsubishi Chemical Corporation, Tokyo (JP); Independent Administrative Institution National Institute for Materials Science, Tsukuba-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/477,421

(22) Filed: May 22, 2012

(65) Prior Publication Data

US 2012/0262648 A1    Oct. 18, 2012

Related U.S. Application Data

(63) Continuation of application No. 11/915,520, filed as application No. PCT/JP2006/310312 on May 24, 2006, now Pat. No. 8,206,611.

(30) Foreign Application Priority Data

| May 24, 2005 | (JP) | ................. | 2005-151183 |
| May 25, 2005 | (JP) | ................. | 2005-152637 |
| Aug. 10, 2005 | (JP) | ................. | 2005-231870 |
| Feb. 2, 2006 | (JP) | ................. | 2006-025994 |

(51) Int. Cl.
  *C09K 11/77* (2006.01)
  *C09K 11/59* (2006.01)

(52) U.S. Cl.
  USPC ............... 252/301.4 F; 252/301.6 F; 257/98; 313/486; 313/487; 313/503; 313/584; 313/467

(58) Field of Classification Search
  USPC ........ 252/301.4 F, 301.6 F; 257/98; 313/486, 313/487, 503, 582, 584, 467
  See application file for complete search history.

(56) References Cited

U.S. PATENT DOCUMENTS

| 5,998,925 | A | 12/1999 | Shimizu et al. |
| 6,066,861 | A | 5/2000 | Hoehn et al. |
| 6,632,379 | B2 | 10/2003 | Mitomo et al. |
| 6,670,748 | B2 | 12/2003 | Ellens et al. |
| 6,682,663 | B2 | 1/2004 | Botty et al. |
| 6,724,142 | B2 | 4/2004 | Ellens et al. |
| 7,262,439 | B2* | 8/2007 | Setlur et al. ............... 257/98 |
| 8,206,611 | B2* | 6/2012 | Hirosaki et al. ....... 252/301.4 F |
| 2002/0043926 | A1 | 4/2002 | Takahashi et al. |
| 2004/0135504 | A1 | 7/2004 | Tamaki et al. |
| 2005/0012075 | A1 | 1/2005 | Sakata et al. |
| 2005/0189863 | A1 | 9/2005 | Nagatomi et al. |
| 2006/0006782 | A1 | 1/2006 | Nagatomi et al. |
| 2006/0017041 | A1 | 1/2006 | Tian et al. |
| 2006/0017365 | A1 | 1/2006 | Nagatomi et al. |
| 2006/0022573 | A1 | 2/2006 | Gotoh et al. |
| 2006/0033083 | A1 | 2/2006 | Sakane et al. |
| 2006/0043337 | A1 | 3/2006 | Sakane et al. |
| 2006/0045832 | A1 | 3/2006 | Nagatomi et al. |
| 2006/0065878 | A1 | 3/2006 | Sakane et al. |
| 2006/0071589 | A1 | 4/2006 | Radkov |
| 2006/0091790 | A1 | 5/2006 | Nagatomi et al. |
| 2006/0097245 | A1 | 5/2006 | Aanegola et al. |
| 2006/0181192 | A1 | 8/2006 | Radkov et al. |
| 2006/0197432 | A1 | 9/2006 | Nagatomi et al. |
| 2006/0255710 | A1 | 11/2006 | Mueller-Mach et al. |
| 2007/0007494 | A1 | 1/2007 | Hirosaki et al. |
| 2007/0040152 | A1 | 2/2007 | Oshio |
| 2007/0108896 | A1 | 5/2007 | Hirosaki |
| 2007/0159091 | A1 | 7/2007 | Hirosaki et al. |
| 2007/0259206 | A1 | 11/2007 | Oshio |
| 2007/0278510 | A1 | 12/2007 | Sakuma et al. |

FOREIGN PATENT DOCUMENTS

| CN | 1522291 | | 8/2004 |
| EP | 1 104 799 | | 6/2001 |
| EP | 1 445 295 | A1 | 8/2004 |
| EP | 1 498 466 | | 1/2005 |
| EP | 1 568 753 | A2 | 8/2005 |
| EP | 1 609 839 | A2 | 12/2005 |
| EP | 1 777 280 | A1 | 4/2007 |
| EP | 1 837 386 | A1 | 9/2007 |
| EP | 1 845 146 | A1 | 10/2007 |

(Continued)

OTHER PUBLICATIONS

Combined Taiwanese Office Action and Search Report Issued Sep. 10, 2012 in Patent Application No. 095118391 (with English translation).

(Continued)

*Primary Examiner* — Carol M Koslow
(74) *Attorney, Agent, or Firm* — Oblon, Spivak, McClelland, Maier & Neustadt, L.L.P.

(57) ABSTRACT

A phosphor which emits light having high brightness, serves as an excellent orange or red phosphor whose light brightness is less decreased when exposed to an excitation source contains a crystal phase having the chemical composition expressed by the general formula [1]:

$$(1-a-b)(Ln'_p M^{II'}_{1-p} M^{III'} M^{IV'} N_3) \cdot a(M^{IV'}_{(3n+2)/4} N_n O) \cdot b(AM^{IV'}_2 N_3) \qquad [1]$$

wherein Ln' represents a metal element selected from the group consisting of lanthanoids, Mn, and Ti; $M^{II'}$ represents a divalent metal element except the Ln' element; $M^{III'}$ represents a trivalent metal element; $M^{IV'}$ represents a tetravalent metal element; A represents a metal element selected from the group consisting of Li, Na, and K; $0<p\leq0.2$; $0\leq a$, $0\leq b$, $a+b>0$, $0\leq n$, and $0.002\leq(3n+2)a/4\leq0.9$.

12 Claims, 12 Drawing Sheets

(56) References Cited

FOREIGN PATENT DOCUMENTS

| | | |
|---|---|---|
| JP | 10-093146 | 4/1998 |
| JP | 10-163535 | 6/1998 |
| JP | 2900928 | 3/1999 |
| JP | 2927279 | 5/1999 |
| JP | 3364229 | 10/2002 |
| JP | 2002-322474 | 11/2002 |
| JP | 2002-363554 | 12/2002 |
| JP | 2003-206481 | 7/2003 |
| JP | 2003-277746 | 10/2003 |
| JP | 2003-321675 | 11/2003 |
| JP | 2004-10786 | 1/2004 |
| JP | 2004-182780 | 7/2004 |
| JP | 2004-244560 | 9/2004 |
| JP | 2004-277663 | 10/2004 |
| JP | 2005-36038 | 2/2005 |
| JP | 2005-48105 | 2/2005 |
| JP | 2005-302920 | 10/2005 |
| JP | 2005-336253 | 12/2005 |
| JP | 2006-8721 | 1/2006 |
| JP | 2006-008948 | 1/2006 |
| JP | 2006-028295 | 2/2006 |
| JP | 2006-063286 | 3/2006 |
| JP | 2006-070088 | 3/2006 |
| JP | 2006-070109 | 3/2006 |
| JP | 2006-306282 | 11/2006 |
| JP | 2006-306981 | 11/2006 |
| WO | WO 2005/052087 A1 | 6/2005 |
| WO | WO 2005/090517 A1 | 9/2005 |
| WO | WO 2005/103199 A1 | 11/2005 |

OTHER PUBLICATIONS

H.A. Hoeppe, et al.; "Luminescence in $Eu^{2+}$-doped $Ba_2Si_5N_8$: fluorescence, thermoluminescene, and upconversion"; May 19, 2000; Journal of Physics and Chemistry of Solids 61, pp. 2001-2006.

J.W.H. van Krevel; "On new rare-earth doped M—Si—Al—O—N materials"; Eindhoven, 2000; pp. 1-173.

Y.Q. Li, et al., "Luminescence properties of $Ce^{3+}$-activated alkaline earth silicon nitride $M_2Si_5N_8$ (M=Ca, Sr, Ba) materials", Journal of Luminescence, vol. 116, XP025185796, May 17, 2005, pp. 107-116.

Office Action issued Mar. 18, 2011 in Europe Application No. 06 756 518.4.

Chinese Office Action dated Oct. 26, 2011 as received in the corresponding Chinese Patent Application No. 200680017011.4 w/English Translation.

European Office Action Issued May 14, 2013 in Patent Application No. 06 756 518.4.

Office Action as received in the corresponding Japanese application No. 2011-257687 dated Oct. 15, 2013 w/English Translation.

* cited by examiner

Fig. 5
Crystal structure of CaAlSiN$_3$
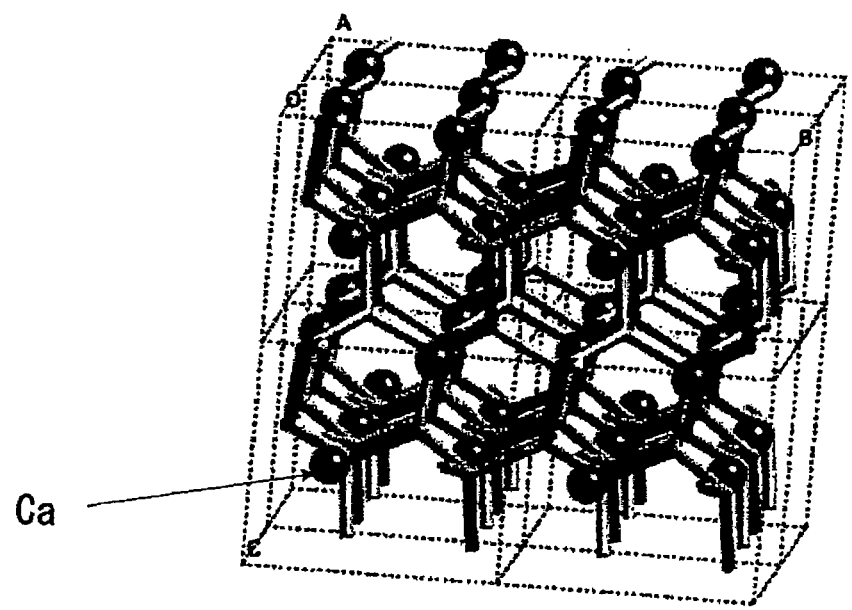
Ca
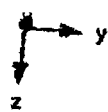

Fig. 6
Crystal structure of $Si_2N_2O$
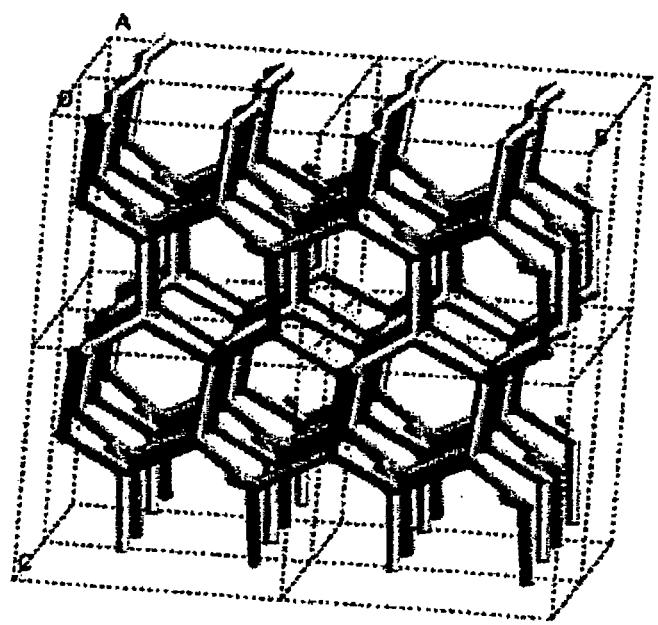

PHOSPHOR AND USE THEREOF

CROSS-REFERENCE TO RELATED APPLICATIONS

This application is a continuation of U.S. application Ser. No. 11/915,520 filed May 22, 2008, now U.S. Pat. No. 8,206,611, which is a 371 of PCT/JP06/310312 filed May 24, 2006 and claims the benefit of JP 2005-151183 filed May 24, 2005, JP 2005-152637 filed May 25, 2005, JP 2005-231870 filed Aug. 10, 2005, and JP 2006-025994 filed Feb. 2, 2006.

TECHNICAL FIELD

The present invention relates to a phosphor composed mainly of an inorganic compound, and a lighting system, a display, a phosphor mixture, a phosphor-containing composition, a pigment, and an ultraviolet absorbing agent taking advantage of properties of the phosphor, more specifically a property of emitting fluorescence having a long wavelength of 570 nm or more.

BACKGROUND ART

Phosphors are used in fluorescent lamps, vacuum fluorescent displays (VFD), field emission displays (FED), plasma display panels (PDP), cathode ray tubes (CRT), and white light emitting devices. Light emission from a phosphor requires the supply of excitation energy to the phosphor. A phosphor is excited by an excitation source having high energy, such as vacuum ultraviolet light, ultraviolet light, visible light, or an electron beam to emit ultraviolet light, visible light, or infrared light. However, the brightness of light emitted from the phosphor exposed to such an excitation source decreases over time.

Therefore, sialon phosphors whose light brightness is less decreased over time have been supposed an alternative to existing phosphors such as silicate phosphors, phosphate phosphors, aluminate phosphors, borate phosphors, sulfide phosphors, and oxysulfide phosphors.

Sialon phosphors are produced by a hot press process, wherein silicon nitride ($Si_3N_4$), aluminum nitride (AlN), calcium carbonate ($CaCO_3$), and europium oxide ($Eu_2O_3$) are mixed at a predetermined molar ratio, and the mixture is fired for 1 hour at a temperature of 1700° C. in a nitrogen atmosphere under atmospheric pressure (0.1 Mpa) (for example, see Patent Document 1). The Eu ion-activated α-sialon obtained through the process is then excited by a blue light having a wavelength of 450 nm to 500 nm to become a phosphor emitting yellow light having a wavelength of 550 nm to 600 nm.

In addition to the phosphor emitting yellow light, phosphors emitting an orange or red light have been demanded for some applications such as white light emitting devices and plasma displays which include ultraviolet light emitting diodes as the excitation source. For white light emitting devices which include a blue light emitting diode as the excitation source, a phosphor which emits an orange or red light has been demanded for the purpose of improving color rendering.

As a phosphor emitting red light, an inorganic substance ($Ba_{2-a}Eu_aSi_5N_8$:a=0.14 to 1.16) composed of $Ba_2Si_5N_8$ crystals activated with Eu has been reported (see Nonpatent Document 1). A phosphor based on a ternary nitride compound of an alkali metal and silicon $M_bSi_cN_d$ which may have various compositions (M=Ca, Sr, Ba, or Zn; b, c, and d take various values) has also been reported (see Nonpatent Document 2). In addition, $M_eSi_fN_g$:Eu (M=Ca, Sr, Ba, or Zn; g=2/3e+4/3f) has also been reported (see Patent Document 2).

Other examples of known sialon, nitride, or oxynitride phosphors include phosphors composed of $MSi_3N_5$, $M_2Si_4N_7$, $M_4Si_6N_{11}$, $M_9Si_{11}N_{23}$, $M_{16}Si_{15}O_6N_{32}$, $M_{13}Si_{18}Al_{12}O_{18}N_{36}$, or $MSi_5AlON_{10}$ (M is Ba, Ca, Sr, or a rare-earth element) as the host crystal activated with Eu or Ce, and some of them have been reported as phosphors emitting red light (Patent Document 3). LED lighting units including these phosphors are also known. In addition, phosphors composed of $Sr_2Si_5N_8$ or $SrSi_7N_{10}$ crystals activated with Ce have been reported (Patent Document 4).

Patent Document 5 describes a $L_hM_iN_{(2/3h+4/3i)}$:Z phosphor (L represents a divalent element such as Ca, Sr, or Ba, M represents a tetravalent element such as Si or Ge, and Z represents an activator such as Eu; h=2 and i=5, or h=1 and i=7), the phosphor exhibiting reduced afterglow when mixed with a small amount of Al. In addition, a light emitting device composed of the phosphor and a blue LED is known, the device emitting a reddish warm white light. Patent Document 6 describes a $L_jM_kN_{(2/3j+4/3k)}$:Z phosphor composed of various L, M, and Z elements. Patent Document 7 describes a wide range of combinations of L-M-N:Eu and Z, but does not mention improvements in the luminescence properties through the use of a specific composition or crystal phase as the matrix.

The phosphors typified by those described in Patent Documents 2 to 7 are composed of a nitride of divalent and tetravalent elements as the host crystal. These phosphors emit red light upon excitation with a visible blue light, but the brightness is insufficient. In addition, some compositions are chemically unstable, and present problems in terms of durability.

As existing lighting systems, white light emitting devices composed of a blue light emitting diode and a blue-light-absorbing yellow-light-emitting phosphor are described in Patent Documents 8, 9, and 10. These light emitting diodes most commonly use a yttrium-aluminum-garnet phosphor activated with cerium, which is expressed by a general formula $(Y, Gd)_3(Al, Ga)_5O_{12}:Ce^{3+}$.

However, the white light emitting device composed of a blue light emitting diode and a yttrium-aluminum-garnet phosphor emits a bluish white light lacking in a red component, so it exhibits unbalanced color rendering.

Patent Documents 11 and 5 describe white light emitting devices, in which two kinds of phosphors have been mixed and dispersed thereby covering a deficiency of the red component of the yttrium-aluminum-garnet phosphor with the other red phosphor. However, the light emitting devices still have problems to be solved in terms of color rendering. The red phosphor described in Patent document 11 includes cadmium which may cause environmental pollution. The red light emitting phosphor described in Patent Document 5, such as $Ca_{1.97}Si_5N_5:Eu_{0.03}$, contains no cadmium, but the phosphor has such a low brightness that its emission intensity is insufficient.

Patent Document 12 discloses a silicon nitride phosphor activated with at least one rare-earth element indispensably containing Ce, a typical example of the phosphor being expressed by $Ca_2(Si, Al)_5N_8:Ce$. According to the description, the phosphor can produce more colors than a known phosphor expressed by $Sr_2Si_5N_8:Ce^{3+}$. Patent Document 13 discloses an oxynitride phosphor containing $Eu^{2+}$ ions as the luminescent center, the phosphor is typified by $Sr_2Al_2Si_3O_2N_6$:Eu, and emits a warm color light or red light.

The phosphor composed of an inorganic compound having the same crystal structure as a $CaAlSiN_3$ crystal, which is known as a heat-resistant material, as the host crystal, and an optically active element, preferably Eu$^{2+}$, as the emission center emits an orange or red light having particularly high brightness. Accordingly, Patent Document 14 (hereinafter referred to as JP 2006-8721) describes a white light emitting device composed of the phosphor, the device providing high emission efficiency, and exhibiting good color rendering with an abundant red component.

Patent Document 1: Japanese Unexamined Patent Application Publication No. 2002-363554
Patent Document 2: U.S. Pat. No. 6,682,663
Patent Document 3: Japanese Unexamined Patent Application Publication No. 2003-206481
Patent Document 4: Japanese Unexamined Patent Application Publication No. 2002-322474
Patent Document 5: Japanese Unexamined Patent Application Publication No. 2003-321675
Patent Document 6: Japanese Unexamined Patent Application Publication No. 2003-277746
Patent Document 7: Japanese Unexamined Patent Application Publication No. 2004-10786
Patent Document 8: Japanese Patent No. 2900928
Patent Document 9: Japanese Patent No. 2927279
Patent Document 10: Japanese Patent No. 3364229
Patent Document 11: Japanese Unexamined Patent Application Publication No. 10-163535
Patent Document 12: Japanese Unexamined Patent Application Publication No. 2004-244560
Patent Document 13: Japanese Unexamined Patent Application Publication No. 2005-48105
Patent Document 14: Japanese Unexamined Patent Application Publication No. 2006-8721
Nonpatent Document 1: H. A. Hoppe et al., "Journal of Physics and Chemistry of Solids" 2000, vol. 61, pages 2001-2006
Nonpatent Document 2: "On new rare-earth doped M-Si—Al—O—N materials" written by J. W. H. van Krevel, TU Eindhoven 2000, ISBN, 90-386-2711-4

The phosphor disclosed in JP 2006-8721, which is composed of an inorganic compound having the same crystal structure as the CaAlSiN$_3$ crystal as the host crystal, is an excellent phosphor having a center emission wavelength of 653 nm and achieving high luminous efficiency.

In general, when a phosphor is used for a lighting system or display, the phosphor is required to have high luminous efficiency and emit light having an intended emission wavelength. This is because, when a phosphor is used for a lighting system, whether the color rendering or luminous flux is prioritized over the other depends on the use conditions. For example, when the luminescent center of a phosphor shifts to a highly visible green side, color rendering tends to deteriorate but the luminous flux increases. Therefore, a phosphor having an intended emission wavelength advantageously enhances the flexibility in designing a lighting system. When the phosphor is used for a display, the range of color reproducibility is adjustable according to the intended use, which enhances the flexibility in the display design.

JP 2006-8721 discloses a method for obtaining a phosphor having a shorter wavelength of the luminescent center, wherein Ca is partially substituted by Sr.

SUMMARY OF INVENTION

The present invention provides a phosphor which emits light having higher brightness than those emitted from existing nitride or oxynitride phosphors, serves as an excellent orange or red phosphor whose light brightness is less decreased over time when exposed to an excitation source, and has an emission wavelength which can be changed by changing the kind of the material, mix proportion, or the like.

The present invention also provides a light emitting device, a lighting system, and a display including the phosphor thereby achieving a high emission efficiency and providing high design flexibility.

The present invention also provides a phosphor mixture, a phosphor-containing composition, a pigment, and an ultraviolet absorbing agent including the phosphor.

As a result of detailed study on various nitride and oxynitride phosphors in view of the above problems, the inventors have found that a phosphor containing a crystal phase having a specific chemical composition is excellent for solving the above problems, and they thus accomplished the present invention.

The present invention has been accomplished on the basis of the findings, and the scope thereof is as follows.

1) A nitride or oxynitride phosphor containing a divalent alkaline earth metal element and a divalent to tetravalent rare-earth metal element, wherein, the nitride or oxynitride phosphor corresponding to the following i) and/or ii):
  i) the alkaline earth metal element is substituted by an element having a lower valence than the alkaline earth metal element and/or a vacancy; and
  ii) the rare-earth metal element is substituted by an element having a lower valence than the rare-earth metal element and/or a vacancy.

2) The nitride or oxynitride phosphor according to 1), wherein the nitrogen ions contained in the phosphor are substituted by oxygen ions.

3) The nitride or oxynitride phosphor according to 1) or 2), which contains a monovalent or zerovalent alkaline earth metal element, and a divalent rare-earth element.

4) A phosphor containing a crystal phase having the chemical composition expressed by the general formula [1]:

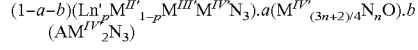

$$(1-a-b)(\text{Ln}'_p M^{II'}{}_{1-p} M^{III'} M^{IV'} N_3) \cdot a(M^{IV'}{}_{(3n+2)/4} N_n O) \cdot b(AM^{IV'}{}_2 N_3) \quad [1]$$

wherein in the general formula [1], Ln' represents at least one metal element selected from the group consisting of lanthanoids, Mn, and Ti; M$^{II'}$ represents one or more elements selected from the group consisting of divalent metal elements except the Ln' element; M$^{III'}$ represents one or more elements selected from the group consisting of trivalent metal elements; M$^{IV'}$ represents one or more elements selected from the group consisting of tetravalent metal elements; A represents one or more monovalent metal elements selected from the group consisting of Li, Na, and K; p satisfies 0<p≤0.2; and a, b, and n satisfy 0≤a, 0≤b, a+b>0, 0≤n, and 0.002≤(3n+2)a/4≤0.9.

5) The phosphor according to 4), wherein the crystal structure of the crystal phase has a space group Cmc2$_1$ or P2$_1$.

6) The phosphor according to 4) or 5), wherein in the general formula [1], M$^{II'}$ includes Ca and Sr at a ratio of 80 mol % or more in total.

7) The phosphor according to 4) to 6), wherein in the general formula [1], M$^{II'}$ is Ca, M$^{III'}$ is Al, and M$^{IV'}$ is Si.

8) The phosphor according to 4) to 7), which is a mixture of a crystal phase having a chemical composition expressed by the general formula [1], a crystal phase having a crystal structure different from that of the above-described crystal phase (hereinafter referred to as "other crystal phase"), and/or an amorphous phase, wherein the proportion of the crystal phase having the chemical composition expressed by the general formula [1] in the mixture is 20% by mass or more.

9) The phosphor according to 8), wherein the other crystal phase and/or the amorphous phase is a conductive inorganic substance.

10) The phosphor according to 9), wherein the conductive inorganic substance is an oxide, oxynitride, nitride, or mixture thereof containing one or more elements selected from the group consisting of Zn, Al, Ga, In, and Sn.

11) The phosphor according to 8) to 10), wherein the other crystal phase and/or the amorphous phase is an inorganic phosphor having a chemical composition different from the chemical composition expressed by the general formula [1].

12) The phosphor according to 4) to 11), which emits fluorescence exhibiting a peak in the wavelength from 550 nm to 700 nm upon irradiation with an excitation source.

13) The phosphor according to 12), wherein the excitation source is ultraviolet light or visible light having a wavelength of 100 nm to 570 nm.

14) The phosphor according to 4) to 13), which contains a crystal phase having the chemical composition expressed by the general formula [10]:

$$(Eu_y Ln''_w M^{II}_{1-y-w} M^{III} M^{IV} N_3)_{1-x} (M^{IV}_{(3n+2)/4} N_n O)_x \quad [10]$$

wherein in the general formula [10], Ln" is at least one metal element selected from the group consisting of lanthanoids except Eu, Mn, and Ti; $M^{II}$ represents divalent metal elements including Mg, Ca, Sr, Ba, and Zn at a ratio of 90 mol % or more in total; $M^{III}$ represents trivalent metal elements including Al at a ratio of 80 mol % or more; $M^{IV}$ represents tetravalent metal elements including Si at a ratio of 90 mol % or more; y satisfies 0<y≤0.2; w satisfies 0≤w<0.2; x satisfies 0<x≤0.45; n satisfies 0≤n; and n and x satisfy 0.002≤(3n+2)x/4≤0.9.

15) The phosphor according to 14), which contains a crystal phase having the chemical composition expressed by the general formula [11]:

$$(Eu_y M^{II}_{1-y} M^{III} M^{IV} N_3)_{1-x} (M^{IV}_{(3n+2)/4} N_n O)_x \quad [11]$$

wherein in the general formula [11], $M^{II}$ represents divalent metal elements including Mg, Ca, Sr, Ba, and Zn at a ratio of 90 mol % or more in total; $M^{III}$ represents trivalent metal elements including Al at a ratio of 80 mol % or more; $M^{IV}$ represents tetravalent metal elements including Si at a ratio of 90 mol % or more; y satisfies 0.0001≤y≤0.1; x satisfies 0<x≤0.45; n satisfies 0≤n; and n and x satisfy 0.002≤(3n+2)x/4≤0.9.

16) The phosphor according to 14) or 15), wherein in the general formula [10] or [11], $M^{II}$ includes Ca and Sr at a ratio of 80 mol % or more in total.

17) The phosphor according to 14) to 16), wherein in the general formula [10] or [11], x satisfies 0.2≤x≤0.4, and n and x satisfy 0.4≤(3n+2)x/4≤0.8.

18) The phosphor according to 14) to 17), wherein in the general formula [10] or [11], $M^{II}$ is Ca, $M^{III}$ is Al, and $M^{IV}$ is Si.

19) The phosphor according to 4) to 13), which contains a crystal phase having the chemical composition expressed by the general formula [21]:

$$(Ce_y Ln_z M^{II}_{1-y-z} M^{III} M^{IV} N_3)_{1-x} (M^{IV}_{(3n+2)/4} N_n O)_x \quad [21]$$

wherein in the general formula [21], Ln is at least one metal element selected from the group consisting of lanthanoids except Ce, Mn, and Ti; $M^{II}$ represents divalent metal elements including Mg, Ca, Sr, Ba, and Zn at a ratio of 90 mol % or more in total; $M^{III}$ represents trivalent metal elements including Al at a ratio of 80 mol % or more; $M^{IV}$ represents tetravalent metal elements including Si at a ratio of 90 mol % or more; x satisfies 0≤x≤0.45; y satisfies 0<y≤0.2; z satisfies 0≤z≤0.2; n satisfies 0≤n; and n and x satisfy 0.002≤(3n+2)x/4≤0.9.

20) The phosphor according to 19), wherein in the general formula [21], $M^{II}$ includes Ca and Sr at a ratio of 80 mol % or more in total.

21) The phosphor according to 19) or 20), wherein in the general formula [21], x satisfies 0.15≤x≤0.3, and n and x satisfy 0.3≤(3n+2)x/4≤0.6.

22) The phosphor according to 19) to 21), wherein in the general formula [21], $M^{II}$ is Ca, m is Al, and $M^{IV}$ is Si.

23) The phosphor according to 4) to 13), which contains a crystal phase having the chemical composition expressed by the general formula [30]:

$$(Eu_y Ln''_w M^{II}_{1-y-w} M^{III} M^{IV} N_3)_{1-x'} (AM^{IV}_2 N_3)_{x'} \quad [30]$$

wherein in the general formula [30], Ln" is at least one metal element selected from the group consisting of lanthanoids except Eu, Mn, and Ti; $M^{II}$ represents divalent metal elements including Mg, Ca, Sr, Ba, and Zn at a ratio of 90 mol % or more in total; $M^{III}$ represents trivalent metal elements including Al at a ratio of 80 mol % or more; $M^{IV}$ represents tetravalent metal elements including Si at a ratio of 90 mol % or more; A represents one or more metal elements selected from Li, Na, and K; x' satisfies 0<x'<1.0; y satisfies 0<y≤0.2; and w satisfies 0≤w<0.2.

24) The phosphor according to 23), which contains a crystal phase having the chemical composition expressed by the general formula [31]:

$$(Eu_y M^{II}_{1-y} M^{III} M^{IV} N_3)_{1-x'} (AM^{IV}_2 N_3)_{x'} \quad [31]$$

wherein in the general formula [31], $M^{II}$ represents divalent metal elements including Mg, Ca, Sr, Ba, and Zn at a ratio of 90 mol % or more in total; $M^{III}$ represents trivalent metal elements including Al at a ratio of 80 mol % or more; $M^{IV}$ represents tetravalent metal elements including Si at a ratio of 90 mol % or more; A represents one or more metal elements selected from the group consisting of Li, Na, and K; x' satisfies 0<x'<0.5; and y satisfies 0<y≤0.2.

25) The phosphor according to 23) or 24), wherein in the general formula [30] or [31], $M^{II}$ includes Ca and Sr at a ratio of 80 mol % or more in total.

26) The phosphor according to 23) to 25), wherein in the general formula [30] or [31], x' satisfies 0.03≤x'≤0.35.

27) The phosphor according to 23) to 26), wherein in the general formula [30] or [31], $M^{II}$ is Ca, $M^{III}$ is Al, and $M^{IV}$ is Si.

28) The phosphor according to 4) to 13), which contains a crystal phase having the chemical composition expressed by the general formula [41]:

$$(Ce_y Ln_z M^{II}_{1-y-z} M^{III} M^{IV} N_3)_{1-x'} (AM^{IV}_2 N_3)_{x'} \quad [41]$$

wherein in the general formula [41], Ln is at least one metal element selected from the group consisting of lanthanoids except Ce, Mn, and Ti; $M^{II}$ represents divalent metal elements including Mg, Ca, Sr, Ba, and Zn at a ratio of 90 mol % or more in total; $M^{III}$ represents trivalent metal elements including Al at a ratio of 80 mol % or more; $M^{IV}$ represents tetravalent metal elements including Si at a ratio of 90 mol % or more; A represents one or more metal elements selected from the group consisting of Li, Na, and K; x' satisfies 0<x'<1.0; y satisfies 0<y≤0.2; and z satisfies 0≤z≤0.2.

29) The phosphor according to 28), wherein in the general formula [41], $M^{II}$ includes Ca and Sr at a ratio of 80 mol % or more in total.

30) The phosphor according to 28) or 29), wherein in the general formula [41], x' satisfies 0.03≤x'≤0.35.

31) The phosphor according to 28) to 30), wherein in the general formula [41], $M^{II}$ is Ca, $M^{III}$ is Al, and $M^{IV}$ is Si.

32) A phosphor containing an alkaline earth metal element, silicon, and nitrogen, in which an inorganic compound having the same crystal structure as that of the phosphor (except for a solid solution of the phosphor) is solid-dissolved.

33) A light emitting device having a first illuminant which emits light having a wavelength of 330 nm to 500 nm, and a second illuminant which emits a visible light upon irradiation with light from the first illuminant, wherein the second illuminant contains the phosphor according to 1) to 32).

34) The light emitting device according to 33), wherein the first illuminant is a laser diode or a light emitting diode.

35) The light emitting device according to 34), wherein the first illuminant is a light emitting diode which emits light having a wavelength of 330 nm to 420 nm, and the second illuminant is composed of the red phosphor according to 1) to 32), a blue phosphor which emits fluorescence exhibiting an emission peak in the wavelength from 420 nm to 500 nm upon excitation with light having a wavelength of 330 nm to 420 nm, and a green phosphor which emits fluorescence exhibiting an emission peak in the wavelength from 500 nm to 570 nm upon excitation with light having a wavelength of 330 nm to 420 nm, and the red, green, and blue lights are mixed thereby producing a white light.

36) The light emitting device according to 34), wherein the first illuminant is a light emitting diode which emits light having a wavelength of 420 nm to 500 nm, and the blue light emitted from the light emitting diode is mixed with the light emitted from the phosphor according to 1) to 32) upon excitation with the light from the first illuminant thereby producing a white light.

37) The light emitting device according to 34), wherein the first illuminant is a light emitting diode which emits light having a wavelength of 420 nm to 500 nm, the second illuminant is composed of the phosphor according to 1) to 32), and a green phosphor which emits fluorescence exhibiting an emission peak in the wavelength from 500 nm to 570 nm upon excitation with light having a wavelength of 420 nm to 500 nm, and thus the light emitting device emits a white light.

38) The light emitting device according to 34), wherein the first illuminant is a light emitting diode which emits light having a wavelength of 420 nm to 500 nm, the second illuminant is composed of the phosphor according to 1) to 32), and a yellow phosphor which emits fluorescence exhibiting an emission peak in the wavelength from 550 nm to 600 nm upon excitation with light having a wavelength of 420 nm to 500 nm, and thus the light emitting device emits a white light.

39) A lighting system including the light emitting device according to 33) to 38).

40) A display having an excitation source and a phosphor, wherein the phosphor at least includes the phosphor according to 1) to 32).

41) The display according to 40), wherein the excitation source is vacuum ultraviolet light having a wavelength of 100 nm to 190 nm, ultraviolet light having a wavelength of 190 nm to 380 nm, or an electron beam.

42) The display according to 41), wherein the phosphor is composed of the phosphor according to 1) to 32), a blue phosphor which emits fluorescence upon excitation with the excitation source, and a green phosphor which emits fluorescence upon excitation with the excitation source.

43) A display including the light emitting device to according to 33) to 38).

44) The display according to 40) to 43), wherein the display is a vacuum fluorescent display (VFD), field emission display (FED), plasma display panel (PDP), or cathode ray tube (CRT).

45) A phosphor mixture containing the phosphor according to 1) to 32).

46) A phosphor-containing composition containing the phosphor according to 1) to 32) and a liquid medium.

47) A pigment containing the phosphor according to 1) to 32).

48) An ultraviolet absorbing agent containing the phosphor according to 1) to 32).

BRIEF DESCRIPTION OF THE DRAWINGS

FIG. 5 shows a structural model of crystals of $CaAlSiN_3$.

FIG. 6 shows a structural model of crystals of $Si_2N_2O$.

DETAILED DESCRIPTION OF THE INVENTION

Figure 1:
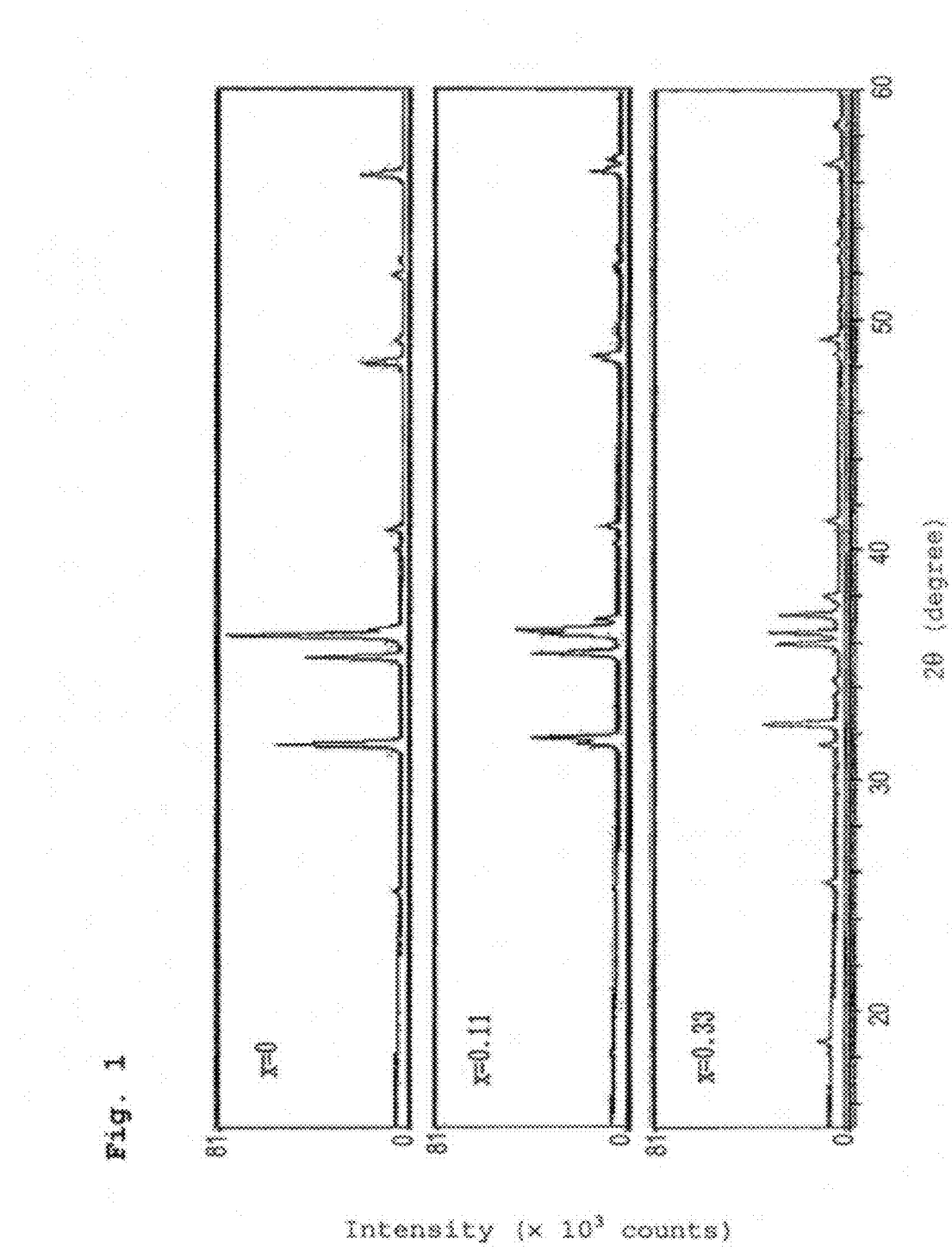
FIG. 1 shows XRD patterns of the substances $Eu_{y(1-x)}Ca_{(1-y)(1-x)}Al_{1-x}Si_{1+x}N_{3-x}O_x$, wherein x=0, 0.11, and 0.33 (oxygen source: $Al_2O_3$, fired at 1900° C. for 2 hours, moles of Eu: y=0.008).

The phosphor according to a first aspect of the invention is a nitride or oxynitride phosphor containing a divalent alkaline earth metal element and a divalent to tetravalent rare-earth metal element, wherein the nitride or oxynitride phosphor corresponding to the following i) and/or ii):

i) the alkaline earth metal element is substituted by an element having a lower valence than the alkaline earth metal element and/or a vacancy; and ii) the rare-earth metal element is substituted by an element having a lower valence than the rare-earth metal element and/or a vacancy.

The phosphor according to a second aspect of the present invention contains a crystal phase having the chemical composition expressed by the general formula [1]:

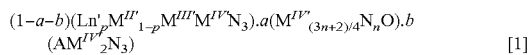

$$(1-a-b)(Ln'_p M^{II'}_{1-p} M^{III'} M^{IV'} N_3) \cdot a(M^{IV'}_{(3n+2)/4} N_n O) \cdot b(AM^{IV'}_2 N_3) \quad [1]$$

wherein in the general formula [1], Ln' represents at least one metal element selected from the group consisting of lanthanoids, Mn, and Ti; $M^{II'}$ represents one or more elements selected from the group consisting of divalent metal elements except the Ln' element; $M^{III'}$ represents one or more elements selected from the group consisting of trivalent metal elements; $M^{IV'}$ represents one or more elements selected from the group consisting of tetravalent metal elements; A represents one or more monovalent metal elements selected from the group consisting of Li, Na, and K; p satisfies $0<p\leq 0.2$; and a, b, and n satisfy $0\leq a$, $0\leq b$, $a+b>0$, $0\leq n$, and $0.002\leq (3n+2)a/4\leq 0.9$.

The phosphor according to a third aspect of the present invention contains an alkaline earth metal element, silicon, and nitrogen, in which an inorganic compound having the same crystal structure as that of the phosphor (except for a solid solution of the phosphor) is solid-dissolved.

The phosphor of the present invention emits light having a higher brightness than existing nitride or oxynitride phosphors, and serves as an excellent orange or red phosphor.

The emission wavelength and emission peak width of the phosphor can be varied by changing the loading of Ce, the kind and/or loading of Ln, which is the second activator, and the proportion of oxygen ions. The visual sensitivity of the phosphor increases as the emission peak thereof shifts toward lower wavelength, which allows the production of a light emitting device having a remarkably increased luminous flux.

In addition, the phosphor of the present invention will not decrease in its brightness even when exposed to an excitation source, thus the phosphor is suitable to fluorescent lamps, FEDs, PDPs, CRTs, and white light emitting devices.

Through the use of the phosphor of the present invention, there are provided a light emitting device and a lighting system which have high luminous efficiency, excellent durability, and offer high design flexibility through adjustable color rendering and luminous flux according to the intended use, and a display which is freely adjustable for the color reproducibility and offers high design flexibility.

The phosphor of the present invention has an orange or red matrix color and absorbs ultraviolet light, so that the phosphor is useful as an orange or red pigment or ultraviolet absorbing agent.

The present invention is further described below, but the following explanation shows an embodiment (typical example) of the present invention, and the present invention is not limited thereto without departing from the scope of the present invention. In the present description, the range of values represented using "to" refers to the range covering the values around "to" as the lower and upper limits, and the average particle diameter means weight-average median diameter ($D_{50}$).

[Phosphor]

The phosphor according to the first aspect, or the phosphor of 1) is a nitride or oxynitride phosphor containing a divalent alkaline earth metal element and a divalent to tetravalent rare-earth metal element, wherein, the nitride or oxynitride phosphor corresponding to the following i) and/or ii):

i) the alkaline earth metal element is substituted by an element having a lower valence than the alkaline earth metal element and/or a vacancy; and ii) the rare-earth metal element is substituted by an element having a lower valence than the rare-earth metal element and/or a vacancy.

In cases where i) is applicable, examples of the element having a lower valence than the alkaline earth metal element include Li, Na, and K.

In cases where ii) is applicable, examples of the element having a lower valence than the rare-earth metal element include alkaline earth metal elements and alkali metal elements, and preferable examples thereof include Ca, Sr, Ba, Li, Na, and K.

The phosphor may contain a monovalent or zerovalent alkaline earth metal element and a divalent rare-earth element thereby introducing a vacancy to the site of the alkaline earth metal element.

Nitrogen ions contained in the phosphor may be substituted by oxygen ions to improve the phosphor in terms of chemical stability and resistance against water and acids thereby increasing the brightness and improving durability of the phosphor.

The phosphor may be a phosphor containing an alkaline earth metal element, silicon, and nitrogen, in which an inorganic compound having the same crystal structure as the phosphor (except for a solid solution of the phosphor) is solid-dissolved.

The phosphor may be based on $Sr_2Si_5N_8$ or $CaAlSiN_3$.

The phosphor of the present invention based on $Sr_2Si_5N_8$ may be, for example, $Sr_2Al_qSi_{5-q}N_8{-}_qO_q$:Eu or $Sr_2Al_qSi_{5-q}N_8{-}_qO_q$:Ce.

The phosphor may be synthesized by a common solid phase reaction method. For example, raw materials as the source of metal elements composing the phosphor are pulverized and mixed by a dry or wet process to prepare a pulverized mixture, and the pulverized mixture is heated thereby producing a phosphor.

Alternatively, the phosphor may be produced by preparing an alloy containing at least two, preferably all metal elements composing the phosphor, and then heating the alloy under pressure in a nitrogen-containing atmosphere.

Alternatively, the phosphor may be produced by preparing an alloy containing some metal elements composing the phosphor, heating the alloy under pressure in a nitrogen-containing atmosphere, thereafter mixing the alloy with other raw materials as another source of metal elements composing the phosphor, and then heating the mixture. The phosphor produced through an alloy contains little impurities and has high brightness.

The phosphor based on $CaAlSiN_3$ is further described below.

The phosphor may contain a crystal phase having the chemical composition expressed by the general formula [1]:

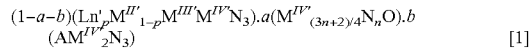

$$(1-a-b)(Ln'_p M^{II'}_{1-p} M^{III'} M^{IV'} N_3) \cdot a(M^{IV'}_{(3n+2)/4} N_n O) \cdot b(AM^{IV'}_2 N_3) \quad [1]$$

wherein in the general formula [1], Ln' is at least one metal element selected from the group consisting of lanthanoids, Mn, and Ti; $M^{II'}$ represents one or more elements selected from the group consisting of divalent metal elements except the Ln' element; $M^{III'}$ represents one or more elements selected from the group consisting of trivalent metal elements; $M^{IV'}$ represents one or more elements selected from the group consisting of tetravalent metal elements; A represents one or more monovalent metal elements selected from the group consisting of Li, Na, and K; p satisfies 0<p≤0.2; and a, b, and n satisfy 0≤a, 0≤b, a+b>0, 0≤n, and 0.002≤(3n+2)a/4≤0.9.

In the general formula [1], Ln' is preferably at least one metal element selected from Ce, Eu, Tb, Sm, Mn, Dy, and Yb from the viewpoint of brightness.

$Mn^{II'}$ preferably contains one or more elements selected from the group consisting of Mg, Ca, Sr, Ba, and Zn at a ratio of 90 mol % or more in total. From the viewpoint of brightness of the phosphor, examples of the elements in $Mn^{II'}$ other than Mg, Ca, Sr, Ba, and Zn include Mn, Sm, Eu, Tm, Yb, Pb, and Sn. From the viewpoint of brightness of the phosphor, $Mn^{II'}$ preferably contains, in particular, Ca and/or Sr at a ratio of 80 mol % or more, more preferably 90 mol % or more, and most preferably 100 mol % in total. In $Mn^{II'}$, the proportion of Ca with reference to the sum of Ca and Sr is preferably more than 10 mol %, and most preferably 100 mol %, or $Mn^{II'}$ is most preferably composed exclusively of Ca.

$Mn^{III'}$ preferably includes Al at a ratio of 80 mol % or more. From the viewpoint of brightness of the phosphor, examples of the elements in $Mn^{III'}$ other than Al include Ga, In, B, Sc, Y, Bi, Sb, La, Ce, Pr, Nd, Sm, Gd, Tb, Dy, Ho, Er, Tln, Yb, and Lu. Among them, Ga, In, B, Bi, Sc, Y, La, Ce, Gd, and Lu are preferable. From the viewpoint of brightness of the phosphor, $Mn^{III'}$ preferably contains Al at a ratio of 90 mol % or more, and most preferably 100 mol %, or $Mn^{III'}$ is most preferably composed exclusively of Al.

$Mn^{IV'}$ preferably includes Si at a ratio of 90 mol % or more. From the viewpoint of brightness of the phosphor, examples of the elements in $Mn^{IV'}$ other than Si include Ge, Sn, Ti, Zr, and Hf. Among them, Ge is preferable. From the viewpoint of brightness of the phosphor, $Mn^{IV'}$ is most preferably composed exclusively of Si.

In the phosphor, the crystal structure of the crystal phase has a space group $Cmc2_1$ or $P2_1$.

The phosphor contains the crystal phase having the chemical composition expressed by the general formula [1] (hereinafter may be referred to as "crystal phase [1]") at a high purity and in the maximum amount, which is most preferably composed of a single phase of the crystal phase [1], has excellent fluorescence properties. However, the phosphor may be a mixture of the crystal phase [1] and a crystal phase having a crystal structure different from the crystal phase [1] (hereinafter referred to as "other crystal phase") and/or an amorphous phase within the range which will not deteriorate the properties. In this case, the content of the crystal phase [1] in the phosphor is preferably 20% by mass or more from the viewpoint of achieving high brightness. The content of the crystal phase [1] in the phosphor is more preferably 50% by mass or more to remarkably improve the brightness. The proportion of the crystal phase [1] in the phosphor may be determined from the intensity ratio between the maximum peaks of the crystal phase [1] and the other phase as measured by X-ray diffraction.

The phosphor containing the crystal phase having the chemical composition expressed by the general formula [1] is further described below.

The chemical composition expressed by the general formula [1] may be expressed by the general formula [10]:

$$(Eu_yLn''_wM^{II}_{1-y-w}M^{III}M^{IV}N_3)_{1-x}(M^{IV}_{(3n+2)/4}N_nO)_x \quad [10]$$

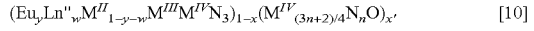

wherein in the general formula [10], Ln" is at least one metal element selected from the group consisting of lanthanoids except Eu, Mn, and Ti. Among them, at least one metal element selected from Ce, Tb, Sm, Mn, Dy, and Yb is preferable from the viewpoint of brightness.

$M^{II}$ represents divalent metal elements containing one or more elements selected from the group consisting of Mg, Ca, Sr, Ba, and Zn at a ratio of 90 mol % or more in total.

$M^{III}$ represents trivalent metal elements including Al at a ratio of 80 mol % or more.

$M^{IV}$ represents tetravalent metal elements including Si at a ratio of 90 mol % or more; y satisfies 0<y≤0.2; w satisfies 0≤w<0.2; x satisfies 0<x≤0.45, n satisfies 0≤n; and n and x satisfy 0.002≤(3n+2)x/4≤0.9.

The chemical composition expressed by the general formula [10] is preferably expressed by the general formula [11]:

$$(Eu_yM^{II}_{1-y}M^{III}M^{IV}N_3)_{1-x}(M^{IV}_{(3n+2)/4}N_nO)_x \quad [11]$$

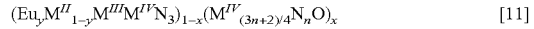

In the general formula [11], $M^{II}$ represents divalent metal elements containing one or more elements selected from Mg, Ca, Sr, Ba, and Zn at a ratio of 90 mol % or more in total. From the viewpoint of brightness of the phosphor, examples of the elements in $M^{II}$ other than Mg, Ca, Sr, Ba, and Zn include Mn, Sm, Eu, Tm, Yb, Pb, and Sn. From the viewpoint of brightness of the phosphor, $M^{II}$ preferably contains, in particular, Ca and/or Sr at a ratio of 80 mol % or more, more preferably 90 mol % or more, and most preferably 100 mol % in total. The proportion of Ca to the sum of Ca and Sr in $M^{II}$ is preferably more than 10 mol %, and most preferably 100 mol %, or $M^{II}$ is most preferably composed exclusively of Ca.

$M^{III}$ represents trivalent metal elements containing Al at a ratio of 80 mol % or more. From the viewpoint of brightness of the phosphor, example of other elements in $M^{III}$ other than Al include Ga, In, B, Sc, Y, Bi, Sb, La, Ce, Pr, Nd, Sm, Gd, Tb, Dy, Ho, Er, Tm, Yb, and Lu. Among them, Ga, In, B, Bi, Sc, Y, La, Ce, Gd, and Lu are preferable. From the viewpoint of brightness of the phosphor, $M^{III}$ preferably contains Al at a ratio of 90 mol % or more, and most preferably 100 mol %, or $M^{III}$ is most preferably composed exclusively Al.

$M^{IV}$ represents tetravalent metal elements containing Si at a ratio of 90 mol % or more. From the viewpoint of brightness, examples of other elements other than Si in $M^{IV}$ include Ge, Sn, Ti, Zr, and Hf. Among them, Ge is preferable. From the viewpoint of brightness, is most preferably composed exclusively of Si.

As long as the phosphor will not significantly decrease in its brightness, the phosphor may contain elements other than divalent, trivalent, tetravalent ones, or monovalent, pentavalent, or hexavalent element at a ratio of 0.05 mol or less in terms of the formula [11] (0.05 mol or less with reference to 1 mol of the formula [11]). In this case, the charge compensation is preferably maintained to minimize lattice defects which cause the decrease in brightness.

Parameters in the general formulae [10] and [11] are described below.

y is the molar ratio of the activating element Eu, and satisfies 0.0001≤y≤0.1. From the viewpoint of emission intensity of the phosphor, y preferably satisfies 0.001≤y≤0.1, and more preferably satisfies 0.003≤y≤0.05. If y is more than 0.1, concentration quenching occurs, and if y is less than 0.0001, luminescence tends to be insufficient.

x and n represent the molar proportion of $M^{IV}_{(3n+2)/4}N_nO$ to the sum of $EuM^{II}M^{III}M^{IV}N_3$:Eu, which is typified by $CaAlSiN_3$:Eu, and $M^{IV}_{(3n+2)/4}N_nO$, which is typified by $Si_2N_2O$, and satisfy 0<x≤0.45, and 0.002≤(3n+2)x/4≤0.9. From the viewpoint of brightness of the phosphor, n and x preferably satisfy 0.01≤x≤0.45 and 0.02≤(3n+2)x/4≤0.9, more preferably satisfy 0.04≤x≤0.4 and 0.08≤(3n+2)x/4≤0.8, further preferably satisfy 0.1≤x≤0.4 and 0.16≤(3n+2)x/4≤0.8, and most preferably satisfy 0.2≤x≤0.4 and 0.4≤(3n+2)x/4≤0.8.

The general formula [11] expresses the theoretical substance of the present invention. The theoretical formula expressed by the general formula [11] may be inapplicable because of the influence of impurity oxygen in $Si_3N_4$ and AlN used as raw materials, or the inclusion of oxygen caused by slight oxidation of $Ca_3N_2$ used as a raw material during mixing to firing operations, but the theoretical formula is employed hereinafter.

The crystal structure of the phosphor of the general formulae [10] and [11] are described below.

A phosphor based on $CaAlSiN_3$ containing oxygen is also disclosed in JP 2006-8721.

The difference between the phosphor according to JP 2006-8721 and the phosphor of the present invention is described below.

The phosphor disclosed in JP 2006-8721 has a crystal structure shown in FIG. 5. As shown in FIG. 5, all the Ca sites are filled, and oxygen is introduced by substituting Si—N with Al—O. The structure is expressed by a composition formula, $CaAl_{1+x}Si_{1-x}N_{3-x}O_x$.

On the other hand, the phosphor of the present invention is specifically typified by a solid solution between $Si_2N_2O$, which is known under the mineral name of Sinoite and has a crystal structure shown in FIG. 6, and $CaAlSiN_3$. In the structure, it is assumed that the Si sites are occupied by Si or Al, and the O sites are partially occupied by N, and some spaces in the skeleton formed by Si—N—O are occupied by Ca. The composition formula is, for example, $(CaAlSiN_3)_{1-x}(Si_2N_2O)_x$, which is expressed by $Ca_{1-x}Al_{1-x}Si_{1+x}N_{3-x}O_x$ with no bracket. This is considered the reason why the wavelength of the phosphor according to JP 2006-8721 does not change even if the value of x changes in the composition formula $caAl_{1+x}Si_{1-x}N_{3-x}O_x$, but the wavelength of the composition of the present invention, $Ca_{1-x}Al_{1-x}Si_{1+x}N_{3-x}O$ changes depending on the value of x.

From the analysis of the crystal structure of the $CaAlSiN_3$ crystal, the inventors revealed that the crystal has a space group $Cmc2_1$ or $P2_1$ and occupies the atomic coordinate sites listed in Table 1, and then determined the atom coordinates by Rietveld analysis. More specifically, the $CaAlSiN_3$ crystal has an orthorhombic system, and the lattice constants a, b, and c are 9.8007 (4) Å, 5.6497 (2) Å, and 5.0627 (2) Å, respectively. The crystal structure of $Si_2N_2O$ is summarized in Table 1. Table 1 indicates that the compounds have the same space group $Cmc2_1$ or $P2_1$.

TABLE 1

| Crystal structure of $CaAlSiN_3$ | | | |
|---|---|---|---|
| $CaAlSiN_3$ Space Group (#36) $Cmc2_1$ | | | |
| | a | b | c |
| Lattice constant (Å) | 9.8007(4) | 5.6497(2) | 5.0627(2) |
| Site | x | y | z |
| Si/Al 8(b) | 0.1734(2) | 0.1565(3) | 0.0504(4) |
| N1 8(b) | 0.2108(4) | 0.1205(8) | 0.3975(2) |

TABLE 1-continued

| Crystal structure of $CaAlSiN_3$ | | | |
|---|---|---|---|
| N2 4(a) | 0 | 0.2453(7) | 0.0000(10) |
| Ca 4(a) | 0 | 0.3144(3) | 0.5283 |
| $SiN_2O$ Space Group (#36) $Cmc2_1$ | | | |
| | a | b | c |
| Lattice constant (Å) | 8.8717 | 5.4909 | 4.8504 |
| Site | x | y | z |
| Si 8(b) | 0.1767 | 0.1511 | 0.0515 |
| N 8(b) | 0.2191 | 0.1228 | 0.3967 |
| O 4(a) | 0 | 0.2127 | 0 |

The $CaAlSiN_3$ crystal is, with reference to the $Si_2N_2O$ crystal which has the same orthorhombic or monoclinic system and the same space group $Cmc2_1$ or $P2_1$, is a crystal in which the Si sites in the $Si_2N_2O$ crystal are occupied by Si and Al, and the O sites are occupied by N, and Ca is captured in the spaces in the skeleton formed by Si—N—O as an interstitial element, wherein Si and Al occupy the Si sites in the $Si_3N_4O$ crystal in an irregularly distributed (disordered) state.

When the constituent elements of $Si_2N_2O$ were fired together with the constituent elements of $CaAlSiN_3$:Eu, a substance based on a mixed crystal of $CaAlSiN_3$ and $Si_2N_2O$ activated with Eu was obtained, and the substance was found to be a phosphor having favorable luminescence properties. The luminescence properties are as described above. More specifically, raw material were mixed to make a composition $Eu_{y(1-x)}Ca_{(1-y)(1-x)}Al_{1-x}Si_{1+x}N_{3-x}O_x$, and fired at a high temperature to obtain an inorganic compound crystal. From the analysis of X-ray diffraction patterns, the crystal was found to have an orthorhombic or monoclinic system, a space group $Cmc2_1$ or $P2_1$, and lattice constants in the intermediate region between $CaAlSiN_3$ and $Si_2N_2O$. FIG. 1 shows X-ray diffraction patterns of the substances obtained through firing at 1900° C. for 2 hours with $Al_2O_3$ as the oxygen source, wherein x=0, 0.11, and 0.33. Table 2 lists the observed values and calculated values of the plane indices and 2θ for the identified peaks. The calculated values were determined from the following formula with the lattice constants of the a, b, and c axes of the orthorhombic system as a, b, and c, respectively, and the plane indices as (hkl):

$$2\theta = 2\sin^{-1}[0.5\lambda(h^2/a^2 + k^2/b^2 + l^2/c^2)^{0.5}]$$

wherein λ is the wavelength 1.54056 Å of Kα ray of Cu used as the X-ray source.

TABLE 2

| Plane indices | | | 2θ in the phosphor with the $Si_2N_2O$ charge proportion x | | | | | |
|---|---|---|---|---|---|---|---|---|
| | | | x = 0 | | x = 0.11 | | x = 0.33 | |
| h | k | l | Observed value | Calculated value | Observed value | Calculated value | Observed value | Calculated value |
| 1 | 1 | 0 | 18.12 | 18.10 | 18.20 | 18.15 | 18.30 | 18.25 |
| 2 | 0 | 0 | 18.12 | 18.11 | 18.33 | 18.30 | 18.78 | 28.75 |
| 1 | 1 | 1 | 25.31 | 25.29 | 25.40 | 25.37 | 25.61 | 25.58 |

TABLE 2-continued

| | | | 2θ in the phosphor with the $Si_2N_2O$ charge proportion x | | | | | |
|---|---|---|---|---|---|---|---|---|
| | | | x = 0 | | x = 0.11 | | x = 0.33 | |
| Plane indices | | | Observed | Calculated | Observed | Calculated | Observed | Calculated |
| h | k | l | value | value | value | value | value | value |
| 0 | 2 | 0 | 25.31 | 31.62 | 31.65 | 31.62 | 31.62 | 31.59 |
| 3 | 1 | 0 | 31.65 | 31.64 | 31.92 | 31.88 | 32.51 | 32.48 |
| 0 | 0 | 2 | 35.46 | 35.45 | 35.62 | 35.59 | 36.03 | 35.99 |
| 0 | 2 | 1 | 35.46 | 36.37 | 36.44 | 36.41 | 36.51 | 36.47 |
| 3 | 1 | 1 | 36.40 | 36.39 | 36.66 | 36.64 | 37.30 | 37.26 |
| 2 | 2 | 0 | 36.40 | 36.68 | 36.66 | 36.78 | 36.51 | 36.98 |
| 4 | 0 | 0 | 36.69 | 36.70 | 37.12 | 37.08 | 38.05 | 38.02 |
| 1 | 1 | 2 | 36.69 | 40.08 | 37.12 | 40.23 | 40.86 | 40.64 |
| 2 | 0 | 2 | 40.09 | 40.09 | 40.31 | 40.30 | 40.92 | 40.88 |
| 2 | 2 | 1 | 40.95 | 40.92 | 41.05 | 41.04 | 41.35 | 41.32 |
| 0 | 2 | 2 | 40.95 | 48.23 | 48.36 | 48.34 | 48.66 | 48.63 |
| 3 | 1 | 2 | 48.25 | 48.24 | 48.54 | 48.52 | 49.29 | 49.26 |
| 1 | 3 | 0 | 48.25 | 49.19 | 48.54 | 49.21 | 48.66 | 49.20 |
| 4 | 2 | 0 | 49.21 | 49.21 | 49.54 | 49.51 | 50.28 | 50.24 |
| 5 | 1 | 0 | 49.21 | 49.22 | 49.72 | 49.69 | 50.88 | 50.85 |
| 2 | 2 | 2 | 51.93 | 51.93 | 52.13 | 52.11 | 52.62 | 52.56 |
| 4 | 0 | 2 | 51.93 | 51.95 | 52.36 | 52.34 | 53.39 | 53.35 |
| 1 | 3 | 1 | 52.61 | 52.61 | 52.36 | 52.66 | 52.75 | 52.72 |
| 4 | 2 | 1 | 52.61 | 52.63 | 52.97 | 52.94 | 53.72 | 53.71 |
| 5 | 1 | 1 | 52.61 | 52.64 | 53.14 | 53.11 | 54.31 | 54.29 |
| 3 | 3 | 0 | 52.61 | 56.33 | 56.51 | 56.49 | 56.85 | 56.82 |
| 6 | 0 | 0 | 56.35 | 56.36 | 57.00 | 56.97 | 58.52 | 58.50 |
| 1 | 1 | 3 | 57.75 | 57.77 | 58.01 | 57.99 | 58.52 | 58.66 |
| 3 | 3 | 1 | 59.42 | 59.46 | 59.66 | 59.64 | 60.06 | 60.03 |
| 1 | 3 | 2 | 62.09 | 62.08 | 62.20 | 62.19 | 62.48 | 62.45 |
| 4 | 2 | 2 | 62.09 | 62.10 | 62.48 | 62.45 | 63.34 | 63.34 |
| 5 | 1 | 2 | 62.09 | 62.11 | 62.48 | 62.60 | 63.92 | 63.87 |
| 0 | 2 | 3 | 64.25 | 64.25 | 64.48 | 64.45 | 65.05 | 65.02 |
| 3 | 1 | 3 | 64.25 | 64.26 | 64.63 | 64.60 | 65.58 | 65.54 |
| 0 | 4 | 0 | 64.25 | 66.04 | 66.07 | 66.05 | 65.99 | 65.96 |
| 6 | 2 | 0 | 66.06 | 66.07 | 66.67 | 66.64 | 68.04 | 68.02 |
| 2 | 2 | 3 | 67.36 | 67.36 | 67.64 | 67.62 | 68.36 | 68.33 |
| 3 | 3 | 2 | 68.34 | 68.34 | 68.59 | 68.57 | 69.16 | 69.12 |
| 0 | 4 | 1 | 68.91 | 68.91 | 68.59 | 68.94 | 68.96 | 68.92 |
| 2 | 4 | 0 | 68.91 | 69.11 | 69.22 | 69.18 | 69.16 | 69.25 |

In FIG. 1, all peaks are expressed by a series of plane indices of the orthorhombic system, and the 2θ site of each XRD peak shifts towards higher side with the increase of the proportion of charged $Si_2N_2O$. Referring to Table 2, this is because that the plane indices (hkl) of $CaAlSiN_3$ crystal change according to the three lattice constants of the orthorhombic system, and thus the lattice spacings (hkl) change. The shift of 2θ for each (hkl) is approximately consistent with the calculated value obtained from the shift of the lattice constants.

In addition, the inventors revealed the atomic coordinates in the crystal by Rietveld analysis. In the structure, the N sites in the $CaAlSiN_3$ crystal are occupied by N and O, and the Al and Si sites, both of which are in a disordered state, are occupied by Al and Si, and the Ca sites are occupied by Ca and vacancies.

From the analysis summarized in Table 2, it is indicated that, with the increase of the x value from 0 to 0.11 and 0.33, the lattice constant of the a axis changes from 9.7873 to 9.6899 and 9.4588, the lattice constant of the b axis changes from 5.6545 to 5.6537 and 5.6604, and the lattice constant of the c axis changes from 5.0600 to 5.0413 and 4.9864.

As described above, the phosphor according to the present invention is regarded as an inorganic compound crystal composed of a solid solution between $CaAlSiN_3$:Eu and $Si_2N_2O$ in which $Eu^{2+}$ ions as the luminescent center are distributed.

A specific compound composed of $CaAlSiN_3$ and $Si_2N_2O$ is illustrated above. It is described in EXAMPLES that the same result is obtained by $M^{VI}_{(3n+2)/4}N_nO$, which is a general formula of $Si_2N_2O$.

The difference between the phosphor of the general formula [11] and the phosphor of Japanese Patent Application Laid-Open No. 2005-48105 is described below.

JP' 105 discloses that the phosphor having a composition formula, a $((1-x-y) MO \cdot xEuO \cdot yCe_2O_3) \cdot bSi_3N_4 \cdot cAlN$ emits a warm red light. According to the description, M is an alkaline earth metal, and is most preferably Sr. As is evident from the general formula MO, JP' 105 must contain the same number of oxygen ions as the alkaline earth metal ions, which is backed up by the fact that the description states that the substance turns into an alkaline earth metal oxide upon firing must be used as the raw material. The crystal structure of the resultant phosphor is not clearly disclosed, but it is suggested that the phosphor may be composed of $Sr_2Al_2Si_3O_2N_6$ as the host crystal.

Regarding the general formula [11], it was studied that a phosphor composed of a host crystal $CaAlSiN_3$, which is disclosed in JP 2006-8721, and an element ion as the luminescent center emits high a deep red light having high brightness. According to the study, it has been found that, in an oxynitride crystal having the same crystal structure as $CaAlSiN_3$, the emission wavelength shifts toward short wavelength side, and a broad emission peak is exhibited. Thus the present invention has been accomplished. More specifically, the present invention is based on deep understanding of the structure of the host crystal of the phosphor. In addition, the general formula [11] requires that the coefficient x for oxygen ions satisfies 0<x≤0.45, so that it does not overlap with the composition range of JP' 105. Accordingly, the general formula [11] and JP' 105 are different in the crystal structure of the matrix, and are regarded as different inventions having the different composition ranges.

The phosphor contains the crystal phase having the chemical composition expressed by the general formula [11] (hereinafter may be referred to as "crystal phase [11]") at a high purity and in the maximum amount, which is most preferably composed of a single phase of the crystal phase [11], has excellent fluorescence properties. However, the phosphor may be a mixture of the crystal phase [11] and a crystal phase having a crystal structure different from the crystal phase [11] and/or an amorphous phase within the range which will not deteriorate the properties. In this case, the content of the crystal phase [11] in the phosphor is preferably 20% by mass or more from the viewpoint of achieving high brightness. The content of the crystal phase [11] in the phosphor is more preferably 50% by mass or more to remarkably improve the brightness. The proportion of the crystal phase [11] in the phosphor may be determined from the intensity ratio between the maximum peaks of the crystal phase [11] and the other phase as measured by X-ray diffraction.

The chemical composition expressed by the general formula [1] may be the general formula [21]. Preferably, the crystal structure of the crystal phase has the same space group $Cmc2_1$ as that of $CaAlSiN_3$.

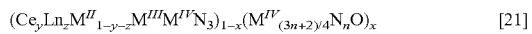
$(Ce_y Ln_z M^{II}_{1-y-z} M^{III} M^{IV} N_3)_{1-x} (M^{IV}_{(3n+2)/4} N_n O)_x$ [21]

In the general formula [21], Ln is at least one metal element selected from the group consisting of lanthanoids except Ce, or La, Pr, Nd, Sm, Eu, Gd, Tb, Dy, Ho, Er, Tm, Yb, and Lu, and Mn, and Ti. Among them, at least one element selected from the group consisting of Eu, Tb, Sm, Mn, Dy, and Yb is preferable from the viewpoint of brightness.

$M^{II}$ represents divalent metal elements containing one or more elements selected from Mg, Ca, Sr, Ba, and Zn at a ratio of 90 mol % or more in total. From the viewpoint of brightness of the phosphor, examples of the elements in $M^{II}$ other than Mg, Ca, Sr, Ba, and Zn include Pb and Sn. From the viewpoint of brightness of the phosphor, $M^{II}$ preferably contains, in particular, Ca and/or Sr at a ratio of 80 mol % or more, more preferably 90 mol % or more, and most preferably 100 mol % in total. The proportion of Ca to the sum of Ca and Sr in $M^{II}$ is preferably more than 10 mol %, and most preferably 100 mol %, or $M^{II}$ is most preferably composed exclusively of Ca.

$M^{III}$ represents trivalent metal elements containing Al at a ratio of 80 mol % or more. From the viewpoint of brightness of the phosphor, example of other elements in $M^{III}$ other than Al include Ga, In, B, Sc, Y, Bi, and Sb. Among them, Ga, In, Sc, and Y are preferable. From the viewpoint of brightness of the phosphor, $M^{III}$ preferably contains Al at a ratio of 90 mol % or more, and most preferably 100 mol %, or $M^{III}$ is most preferably composed exclusively Al.

$M^{IV}$ represents tetravalent metal elements containing Si at a ratio of 90 mol % or more. From the viewpoint of brightness, examples of other elements other than Si in $M^{IV}$ include Ge, Sn, Zr, and Hf. Among them, Ge is preferable. From the viewpoint of brightness, $M^{IV}$ is most preferably composed exclusively of Si.

As long as the phosphor will not significantly decrease in its brightness, the phosphor may contain elements other than divalent, trivalent, tetravalent ones, or monovalent, pentavalent, or hexavalent element at a ratio of 0.05 mol or less in terms of the general formula [21] (0.05 mol or less with reference to 1 mol of the general formula [21]). In this case, the charge compensation is preferably maintained to minimize lattice defects which cause the decrease in brightness.

Parameters in the general formula [21] are described below.

y and z are parameters representing the amount of the activator. y is the molar ratio of the activating element Eu, and satisfies 0<y≤0.2. When the activator is Ce alone, the emission wavelength shifts toward short wavelength side in comparison with the case where the activator is Eu alone. If y is more than 0.2, concentration quenching occurs, and if y is less than 0.0005, luminescence tends to be insufficient. Accordingly, y preferably satisfies 0.0005<y≤0.1.

z is the molar ratio of the second activating element Ln, and satisfies 0≤z≤0.2. From the viewpoint of emission intensity, z preferably satisfies 0.0001≤z≤0.01, and more preferably satisfies 0.0003≤z≤0.05.

x is a parameter representing the state of oxygen atoms in the host crystal. When oxygen ions are introduced into the crystal, in the first case, all the Ca sites in the crystal are occupied, so that oxygen is introduced through substitution of Si—N with Al—O. In the second case, the Si sites are occupied by Si or Al, the O sites are partially occupied by N, and some spaces in the skeleton formed by Si—N—O are occupied by Ca, and thus oxygen is introduced. In the third case, the first and second cases occur simultaneously. From this viewpoint, x is introduced in such a manner that the principle of electrical neutrality is maintained for $M^{II}$, $M^{III}$, and $M^{IV}$ ions through the introduction of oxygen ions, wherein x satisfies 0≤x≤0.45. From the viewpoint of brightness, x preferably satisfies 0≤x≤0.3, more preferably satisfies 0.002≤x≤0.3, and further preferably satisfies 0.15≤x≤0.3.

n is 0 or a positive numeral, n=0 represents $SiO_2$, and n=2 represents $Si_2N_2O$ (Sinoite). n and x satisfy 0.002≤(3n+2)x/4≤0.9. From the viewpoint of brightness, n and x preferably satisfy 0.004≤(3n+2)x/4≤0.6, and more preferably satisfy 0.3≤(3n+2)x/4≤0.6.

The general formula [21] expresses a theoretical substance. The content of oxygen and nitrogen in the actual substance may be different from the theoretical values because of the influence of impurity oxygen in $Si_3N_4$ and AlN to be used as raw materials, or the inclusion of oxygen from the outside of the sample, which causes slight oxidation of $Ca_3N_2$ and others used as the raw materials during the operations from raw material mixing to firing. However, the slight difference in the content of oxygen and nitrogen will not affect the luminous properties, so that the actual content of oxygen and nitrogen may be slightly different from the value according to the formula [21].

The crystal structure of the phosphor of the general formula [21] is described below.

In the solid solution system of the general formulae $M^{II}M^{III}M^{IV}N_3$ and $M^{IV}_{(3n+2)/4}N_nO$, when the activator is Ce, the emission peak shifts toward short wavelength side and brightness remarkably increases. When $M^{II}M^{III}M^{IV}N_3$ is used alone, the emission peak shifts toward short wavelength side by adding Ln to Ce as another activator.

In the general formula [21], Ca, Al, and Si were selected as $M^{II}$, $M^{III}$, and $M^{IV}$, respectively, and the raw materials were added to satisfy x=0.18, y(1−x)=0.032, and z(1−x)=0. After firing at a high temperature, the analysis of the X-ray diffraction pattern indicated that the resultant crystal has an orthorhombic (or monoclinic) system, a space group $Cmc2_1$ (or $P2_1$), and lattice constants in the intermediate region between $CaAlSiN_3$ and $Si_2N_2O$. As described above, FIG. 1 shows X-ray diffraction patterns of the substances obtained through firing at 1900° C. for 2 hours with $CeO_2$ and $Al_2O_3$ as the oxygen sources.

The main crystal phase of the phosphor preferably has a space group $Cmc2_1$. The crystal may be partially not orthorhombic but monoclinic depending on synthesis conditions such as firing temperature, and thus have a space group different from $Cmc2_1$. However, the luminescence properties are little affected, so that the crystal is still useful as a high-brightness phosphor.

The phosphor contains the crystal phase having the chemical composition expressed by the general formula [21] (hereinafter may be referred to as "crystal phase [21]") at a high purity and in the maximum amount, which is most preferably composed of a single phase of the crystal phase [21], has excellent fluorescence properties. However, the phosphor may be a mixture of the crystal phase [21] and a crystal phase having a crystal structure different from the crystal phase [21] and/or an amorphous phase within the range which will not deteriorate the properties. In this case, the content of the crystal phase [21] in the phosphor is preferably 20% by mass or more from the viewpoint of achieving high brightness. The content of the crystal phase [21] in the phosphor is more preferably 50% by mass or more to remarkably improve the brightness. The proportion of the crystal phase [21] in the phosphor may be determined from the intensity ratio between the maximum peaks of the crystal phase [21] and the other phase as measured by X-ray diffraction.

The chemical composition expressed by the general formula [1] may be the general formula [30]. Preferably, the crystal structure of the crystal phase has the same space group $Cmc2_1$ as that of $CaAlSiN_3$.

$(Eu_y Ln''_w M^{II}_{1-y-w} M^{III} M^{IV} N_3)_{1-x'}(AM^{IV}_2 N_3)_{x'}$ [30]

In the general formula [30], Ln" is at least one metal element selected from the group consisting of lanthanoids except Eu, Mn, and Ti. Among them, at least one metal element selected from Ce, Tb, Sm, Mn, Dy, and Yb is preferable from the viewpoint of brightness.

$M^{II}$ represents divalent metal elements containing one or more elements selected from the group consisting of Mg, Ca, Sr, Ba, and Zn at a ratio of 90 mol % or more in total. $M^{III}$ represents trivalent metal elements containing Al at a ratio of 80 mol % or more. $M^{IV}$ represents tetravalent metal elements containing Si at a ratio of 90 mol % or more, and A represents one or more metal elements selected from the group consisting of Li, Na, and K. x' satisfies 0<x'<1.0, y satisfies 0<y≤0.2, and w satisfies 0≤w<0.2.

The chemical composition expressed by the general formula [30] is preferably expressed by the general formula [31]:

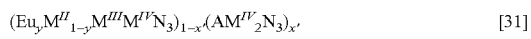

$(Eu_y M^{II}_{1-y} M^{III} M^{IV} N_3)_{1-x'}(AM^{IV}_2 N_3)_{x'}$ [31]

In the general formula [31], $M^{II}$ represents divalent metal elements including one or more elements selected from Mg, Ca, Sr, Ba, and Zn at a ratio of 90 mol % or more in total, $M^{III}$ represents trivalent metal elements including Al at a ratio of 80 mol % or more, $M^{IV}$ represents tetravalent metal elements including Si at a ratio of 90 mol % or more, A represents one or more metal elements selected from the group consisting of Li, Na, and K, x' satisfies 0<x'<0.5, and y satisfies 0<y≤0.2.

In the general formula [31], $M^{II}$ represents divalent metal elements containing one or more elements selected from Mg, Ca, Sr, Ba, and Zn at a ratio of 90 mol % or more in total. From the viewpoint of brightness of the phosphor, $M^{II}$ preferably contains, in particular, Ca and/or Sr at a ratio of 80 mol % or more, more preferably 90 mol % or more, and most preferably 100 mol % in total. The proportion of Ca to the sum of Ca and Sr in $M^{II}$ is preferably more than 10 mol %, and most preferably 100 mol %, or $M^{II}$ is most preferably composed exclusively of Ca. $M^{II}$ may contain, in addition to Eu, another activating element such as Mn.

$M^{III}$ represents trivalent metal elements containing Al at a ratio of 80 mol % or more. From the viewpoint of brightness of the phosphor, example of other elements in $M^{III}$ other than Al include Ga, In, B, Sc, Y, Bi, and Sb. Among them, Ga, In, Sc, and Y are preferable. From the viewpoint of brightness of the phosphor, $M^{III}$ preferably contains Al at a ratio of 90 mol % or more, and most preferably 100 mol %, or $M^{III}$ is most preferably composed exclusively Al.

$M^{IV}$ represents tetravalent metal elements containing Si at a ratio of 90 mol % or more. From the viewpoint of brightness, examples of other elements other than Si in $M^{IV}$ include Ge, Sn, Zr, and Hf. Among them, Ge is preferable. From the viewpoint of brightness, $M^{IV}$ is most preferably composed exclusively of Si.

A represents one or more metal elements selected from the group consisting of Li, Na, and K. From the viewpoint of brightness, A preferably represents Li and/or Na, and more preferably Li.

As long as the phosphor will not significantly decrease in its brightness, the phosphor may contain elements other than monovalent, divalent, trivalent, tetravalent ones, or pentavalent or hexavalent element at a ratio of 0.05 mol or less in terms of the general formula [31] (0.05 mol or less with reference to 1 mol of the general formula [31]). In this case, the charge compensation is preferably maintained to minimize lattice defects which cause the decrease in brightness.

Parameters in the general formula [31] are described below.

y is a parameter representing the amount of Eu. y is the molar ratio of Eu, and satisfies 0<y≤0.2. If y is more than 0.2, concentration quenching occurs, and if y is less than 0.003, luminescence tends to be insufficient. Accordingly, y preferably satisfies 0.003≤y≤0.2.

x' is a parameter representing the state of A, or one or more monovalent metal elements selected from the group consisting of Li, Na, and K. x' was introduced in such a manner that the principle of electrical neutrality was maintained for the $M^{II}$, $M^{III}$, and $M^{IV}$ ions through the introduction of one or more ions selected from Li, Na, and K. x' satisfies 0<x'<0.5. From the viewpoint of brightness, x' preferably satisfies 0.002≤x'≤0.4, and more preferably satisfies 0.03≤x'≤0.35.

The general formula [31] expresses a theoretical substance. The content of oxygen and nitrogen in the actual substance may be different from the theoretical values because of the influence of impurity oxygen in $Si_3N_4$ and AlN to be used as raw materials, or the inclusion of oxygen from the outside of the sample, which causes slight oxidation of $Ca_3N_2$ and others used as the raw materials during the operations from raw material mixing to firing. However, the slight difference in the content of oxygen and nitrogen will not affect luminous properties, so that the actual content of oxygen and nitrogen may be slightly different from the value according to the formula [31].

The crystal structure of the phosphor of the general formula [31] is described below.

The host crystal of the phosphor is regarded as a solid solution between $ASi_2N_3$ (wherein A represents one or more metal elements selected from the group consisting of Li, Na, and K), which has the same crystal structure as $CaAlSiN_3$, and $CaAlSiN_3$. The composition formula is, for example, $(CaAlSiN_3)_{1-x'}(ASi_2N_3)_{x'}$, which is expressed by $Ca_{1-x'}A_{x'}Al_{1-x'}Si_{1+x'}N_3$ with no bracket. The solid solution between $CaAlSiN_3$ and $ASi_2N_3$ is provided herein as a specific example, which is expressed by a general formula $M^{II}_{1-x'}A_{x'}M^{III}_{1-x'}M^{IV}_{1+x'}N_3$ as the solid solution between $M^{II}M^{III}M^{IV}N_3$ and $AM^{IV}_2N_3$.

The inventors have found that, in the system, when the activator is Eu, the luminescence properties can be varied by changing the loading of Eu of the proportion of solid-dissolved $AM^{IV}_2N_3$.

In the general formula [31], Ca, Al, Si, and Li were selected as $M^{II}$, $M^{III}$, $M^{IV}$ and A, respectively, y(1−x') was fixed at 0.008, and the raw materials were added to satisfy x'=0, 0.18, and 0.33. After firing at a high temperature, the peak position as measured by X-ray diffraction was, as shown in Table 3, in good agreement with the peak position calculated from the atomic coordinates under the assumption that the space group was $Cmc2_1$.

TABLE 3

| Plane indices | | | 2θ in the phosphor with the $LiSi_2N_3$ charge proportion x' | | | | | |
|---|---|---|---|---|---|---|---|---|
| | | | x' = 0 | | x' = 0.18 | | x' = 0.33 | |
| h | k | l | Observed value | Calculated value | Observed value | Calculated value | Observed value | Calculated value |
| 4 | 0 | 0 | 36.59 | — | 37.05 | — | 37.50 | — |
| 0 | 2 | 0 | 31.49 | — | 31.52 | — | 31.66 | — |
| 0 | 0 | 2 | 35.31 | — | 35.55 | — | 35.89 | — |
| 3 | 1 | 0 | 33.05 | 31.54 | 31.84 | 31.84 | 32.13 | 32.16 |
| 0 | 2 | 1 | 36.23 | 36.22 | 36.32 | 36.31 | 36.53 | 36.51 |
| 3 | 1 | 1 | 36.23 | 36.26 | 36.61 | 36.59 | 36.95 | 36.96 |
| 2 | 0 | 2 | 39.93 | 39.93 | 40.25 | 40.26 | 40.70 | 40.67 |
| 2 | 2 | 1 | 40.80 | 40.76 | 41.01 | 40.94 | 41.27 | 41.23 |
| 0 | 2 | 2 | 48.09 | 48.03 | 48.52 | 48.24 | 48.65 | 48.60 |
| 3 | 1 | 2 | 48.09 | 48.06 | 49.45 | 48.46 | 49.03 | 48.95 |
| 5 | 1 | 0 | 49.06 | 49.06 | 49.73 | 49.63 | 50.28 | 50.22 |
| 4 | 0 | 2 | 51.78 | 51.76 | 52.31 | 52.29 | 52.94 | 52.88 |
| 5 | 1 | 1 | 52.50 | 52.47 | 53.07 | 53.05 | 53.73 | 53.67 |
| 3 | 3 | 0 | 56.19 | 56.10 | 56.47 | 56.33 | 56.80 | 56.70 |
| 6 | 0 | 0 | 56.19 | 56.18 | 57.00 | 56.92 | 57.69 | 57.66 |

Table 3 lists the observed values of 2θ when the plane indices (hkl) are (400), (020), and (002), and the calculated values of 2θ of the other plane indices obtained using the lattice constants a, b, and c in the orthorhombic system of $Cmc2_1$ determined using the following formula [2]. The experimental values of 2θ agrees with the calculated values within a small error.

$$2\theta = 2\sin^{-1}[0.5\lambda(h^2/a^2 + k^2/b^2 + l^2/c^2)^{0.5}]\qquad [2]$$

λ represents the wavelength of Kα ray of Cu used as the X-ray source, and the value is 1.54056 Å. From the analysis of X-ray diffraction patterns, the resultant crystal was found to have an orthorhombic system, a space group $Cmc2_1$, and lattice constants in the intermediate region between $CaAlSiN_3$ and $LiSi_2N_3$.

The main crystal phase in the phosphor of the general formula [31] preferably has a space group $Cmc2_1$. The crystal may be partially not orthorhombic but monoclinic depending on synthesis conditions such as firing temperature, and thus have a space group different from $Cmc2_1$. However, the luminescence properties are little affected, so that the crystal is still useful as a high-brightness phosphor.

The phosphor contains the crystal phase having the chemical composition expressed by the general formula [31] (hereinafter may be referred to as "crystal phase [31]") at a high purity and in the maximum amount, which is most preferably composed of a single phase of the crystal phase [31], has excellent fluorescence properties. However, the phosphor may be a mixture of the crystal phase [31] and a crystal phase having a crystal structure different from the crystal phase [31] and/or an amorphous phase within the range which will not deteriorate the properties. In this case, the content of the crystal phase [31] in the phosphor is preferably 20% by mass or more from the viewpoint of achieving high brightness. The content of the crystal phase [31] in the phosphor is more preferably 50% by mass or more to remarkably improve the brightness. The proportion of the crystal phase [31] in the phosphor may be determined from the intensity ratio between the maximum peaks of the crystal phase [31] and the other phase as measured by X-ray diffraction.

The chemical composition expressed by the general formula [1] may be the general formula [31]. Preferably, the crystal structure of the crystal phase has the same space group $Cmc2_1$ as that of $CaAlSiN_3$.

$(Ce_yLn_zM^{II}_{1-y-z}M^{III}M^{IV}N_3)_{1-x'}(AM^{IV}_2N_3)_{x'}$      [41]

In the general formula [41], Ln is at least one metal element selected from the group consisting of lanthanoids except Ce, or La, Pr, Nd, Sm, Eu, Gd, Tb, Dy, Ho, Er, Tm, Yb, and Lu, and Mn, and Ti. Among them, at least one element selected from the group consisting of Eu, Tb, Sm, Mn, Dy, and Yb is preferable from the viewpoint of brightness.

$M^{II}$ represents divalent metal elements containing one or more elements selected from Mg, Ca, Sr, Ba, and Zn at a ratio of 90 mol % or more in total; $M^{III}$ represents trivalent metal elements including Al at a ratio of 80 mol % or more; $M^{IV}$ represents tetravalent metal elements including Si at a ratio of 90 mol % or more; A represents one or more metal elements selected from the group consisting of Li, Na, and K; x' satisfies 0<x'<1.0; y satisfies 0<y≤0.2; and z satisfies 0≤z≤0.2.

$M^{II}$ represents divalent metal elements containing one or more elements selected from Mg, Ca, Sr, Ba, and Zn at a ratio of 90 mol % or more in total. From the viewpoint of brightness of the phosphor, $M^{II}$ preferably contains, in particular, Ca and/or Sr at a ratio of 80 mol % or more, more preferably 90 mol % or more, and most preferably 100 mol % in total. The proportion of Ca to the sum of Ca and Sr in $M^{II}$ is preferably more than 10 mol %, and most preferably 100 mol %, or $M^{II}$ is most preferably composed exclusively of Ca. $M^{II}$ may contain, in addition to Ce, another activating element such as Mn.

$M^{III}$ represents trivalent metal elements containing Al at a ratio of 80 mol % or more. From the viewpoint of brightness of the phosphor, example of, other elements in $M^{III}$ other than Al include Ga, In, B, Sc, Y, Bi, and Sb. Among them, Ga, In, Sc, and Y are preferable. From the viewpoint of brightness of the phosphor, $M^{III}$ preferably contains Al at a ratio of 90 mol % or more, and most preferably 100 mol %, or $M^{III}$ is most preferably composed exclusively Al.

$M^{IV}$ represents tetravalent metal elements containing Si at a ratio of 90 mol % or more. From the viewpoint of brightness, examples of other elements other than Si in $M^{IV}$ include Ge, Sn, Zr, and Hf. Among them, Ge is preferable. From the viewpoint of brightness, $M^{IV}$ is most preferably composed exclusively of Si.

A represents one or more monovalent metal elements selected from the group consisting of Li, Na, and K. From the viewpoint of brightness, A preferably represents Li and/or Na, and more preferably Li.

As long as the phosphor will not significantly decrease in its brightness, the phosphor may contain elements other than monovalent, divalent, trivalent, tetravalent ones, or pentavalent, or hexavalent element at a ratio of 0.05 mol or less in terms of the general formula [41] (0.05 mol or less with reference to 1 mol of the general formula [41]). In this case, the charge compensation is preferably maintained to minimize lattice defects which cause the decrease in brightness.

Parameters in the general formula [41] are described below.

y is a parameter representing the amount of Ce. y is the molar ratio of Ce, and satisfies $0<y\le0.2$. If y is more than 0.2, concentration quenching occurs, and if y is less than 0.003, luminescence tends to be insufficient. Accordingly, y preferably satisfies $0.003\le y\le0.2$.

x' is a parameter representing the state of A, or one or more monovalent metal elements selected from the group consisting of Li, Na, and K. x' was introduced in such a manner that the principle of electrical neutrality was maintained for the $M^{II}$, $M^{III}$, and $M^{IV}$ ions through the introduction of one or more ions selected from Li, Na, and K. x' satisfies $0<x'<1.0$. From the viewpoint of brightness, x' preferably satisfies $0.002\le x'\le0.4$, and more preferably satisfies $0.03\le x'\le0.35$.

z is the molar ratio of the second activating element Ln, and satisfies $0\le z\le0.2$.

The general formula [41] expresses a theoretical substance. The content of oxygen and nitrogen in the actual substance may be different from the theoretical values because of the influence of impurity oxygen in $Si_3N_4$ and AlN to be used as raw materials, or the inclusion of oxygen from the outside of the sample, which causes slight oxidation of $Ca_3N_2$ and others used as the raw materials during the operations from raw material mixing to firing. However, the slight difference in the content of oxygen and nitrogen will not affect luminous properties, so that the actual content of oxygen and nitrogen may be slightly different from the value according to the formula [41].

The crystal structure of the crystal phase having the chemical composition expressed by the general formula [41] is the same as the crystal structure of the crystal phase having the chemical composition expressed by the general formula [31]. The main crystal phase preferably has a space group $Cmc2_1$. The crystal may be partially not orthorhombic but monoclinic depending on synthesis conditions such as firing temperature, and thus have a space group different from $Cmc2_1$. However, the luminescence properties are little affected, so that the crystal is still useful as a high-brightness phosphor.

The phosphor contains the crystal phase having the chemical composition expressed by the general formula [41] (hereinafter may be referred to as "crystal phase [41]") at a high purity and in the maximum amount, which is most preferably composed of a single phase of the crystal phase [41], has excellent fluorescence properties. However, the phosphor may be a mixture of the crystal phase [41] and a crystal phase having a crystal structure different from the crystal phase [41] and/or an amorphous phase within the range which will not deteriorate the properties. In this case, the content of the crystal phase [41] in the phosphor is preferably 20% by mass or more from the viewpoint of achieving high brightness. The content of the crystal phase [41] in the phosphor is more preferably 50% by mass or more to remarkably improve the brightness. The proportion of the crystal phase [41] in the phosphor may be determined from the intensity ratio between the maximum peaks of the crystal phase [41] and the other phase as measured by X-ray diffraction.

[Particle Diameter of Phosphor]

When the phosphor of the present invention is used in powder form, the average particle diameter is preferably from 0.1 μm to 20 μm from the viewpoint of, for example, dispersibility in resins and flowability of the powder. When the powder is composed of single crystal particles within the range, the luminous brightness is further improved.

[Impurities in Phosphor]

The phosphor preferably contains as little impurities as possible to obtain a phosphor having high luminous brightness. In particular, in order to limit the content of Fe, Co, and Ni impurity elements, which inhibit light emission when contained abundantly, to 500 ppm or less in total, care must be taken on the selection of raw material powders and control of the synthesis process.

[Excitation of Phosphor with Electron Beam]

When the phosphor of the present invention is to be excited with an electron beam, conductivity may be imparted to the phosphor by adding a conductive inorganic substance to the crystal phase [1], [11], [21], [31] or [41] as the other crystal phase and/or amorphous phase. Examples of the conductive inorganic substance include oxides, oxynitrides, nitrides, or mixtures thereof containing one or more elements selected from Zn, Al, Ga, In, and Sn.

The other crystal phase and/or amorphous phase may be an inorganic phosphor having a chemical composition different from the chemical composition expressed by the general formula [1].

[Phosphor Production Process]

The phosphor of the present invention is a mixture of metal compounds, and is produced by firing a mixture of raw materials, which are capable of composing the composition expressed by the general formula [11], [21], [31] or [41], at a temperature ranging from 1200° C. to 2200° C. in an inert atmosphere containing nitrogen.

The main crystal of the phosphor of the general formula [11] has a space group $Cmc2_1$. The crystal may be partially not orthorhombic but monoclinic depending on synthesis conditions such as firing temperature, and thus contain a space group different from $Cmc2_1$. However, the luminescence properties of the luminescent center element, or Eu site is little affected, so that the crystal is still useful as a high-brightness phosphor.

In particular, when the phosphor of the general formula [11] is produced by the above process, the starting material is preferably mixed powder of metal compounds containing europium nitride and/or europium oxide, calcium nitride, silicon nitride, and aluminum nitride, in addition, as the oxygen source for $Si_2N_2O$, alumina, silica, calcium carbonate, calcium oxide, or a complex oxide of Al and Si, Al and Ca, Si and Ca, or Al, Si, and Ca.

In particular, when the phosphor of the general formula [21], wherein Ln is Eu, is produced by the above process, the starting material is preferably mixed powder of metal compounds containing cerium oxide, europium nitride, and/or europium oxide, calcium nitride, silicon nitride, aluminum nitride, in addition, as the oxygen source, alumina, silica, calcium carbonate, calcium oxide, or, a complex oxide of Al and Si, Al and Ca, Si and Ca, or Al, Si, and Ca.

In particular, when the phosphor $(Eu_yCa_{1-y}AlSiN_3)_{1-x'}(LiSi_2N_3)_{x'}$ of the general formula [31], wherein $M^{II}$ is Ca, $M^{III}$ is Al, $M^{IV}$ is Si, and A is Li, the starting material is preferably a powder mixture composed of europium nitride, calcium nitride, lithium nitride, silicon nitride, and aluminum nitride.

In particular, when the phosphor $(Ce_yCa_{1-y-z}MAlSiN_3)_{1-x'}(LiSi_2N_3)_{x'}$ of the general formula [41], wherein $M^{II}$ is Ca, $M^{III}$ is Al, $M^{IV}$ is Si, and A is Li, the starting material is preferably a powder mixture composed of cerium nitride, cerium calcium, calcium nitride, lithium nitride, silicon nitride, and aluminum nitride.

When firing the raw material mixture, the mixed powder of the metal compounds may be fired with the volume filling rate kept at 40% or lower. The volume filling rate may be determined by (bulk density of mixed powder)/(theoretical density of mixed powder)×100[%]. When the mixed powder is fired with the volume filling rate kept at 40% or lower, the raw material powders are fired with free spaces maintained around particles. As a result of this, the crystals of $CaAlSiN_3$, which are the reaction product, grow in free spaces with less contact with each other. Accordingly, crystals having less surface defects are synthesized.

When the raw material mixture is fired, the vessel for keeping the raw materials may be made of various heat-resistant materials, and is preferably made of sintered boron nitride described in Journal of the American Ceramic Society, 2002, vol. 85, No. 5, pp. 1229-1234, which is less reactive to metal compounds such as metal nitrides and exerts less deleterious effects due to material deterioration.

The firing temperature is very high and the firing atmosphere is an inert atmosphere containing nitrogen, so that the furnace used for firing is preferably an electric furnace of metal resistance heating type or graphite resistance heating type composed of carbon in the high-temperature portion of the furnace. The method for firing is preferably a sintering method with no application of external mechanical pressure, such as an atmospheric sintering method or a gas pressure sintering method.

The firing time varies depending on the firing temperature, but is usually about 1 hour to 10 hours.

If the powder aggregate obtained by firing is firmly coagulated, it is pulverized by a common industrial mill such as a ball mill or jet mill. Pulverization is preferably conducted so as to produce powder having an average particle diameter of 20 μm or less, most preferably from 0.1 μm to 5 μm. Powder having an average particle diameter exceeding 20 μm exhibits poor flowability and dispersibility in resins. Accordingly, if the powder is combined with a luminescence light source or excitation source to form a lighting system or display, the emission intensity may be nonuniform in some regions. If the powder is pulverized to achieve an average particle diameter of less than 0.1 μm, the amount of defects on the phosphor powder surface increases, so that the emission intensity may decrease depending on the composition of the phosphor.

Alternatively, the phosphor may be produced by preparing an alloy containing at least two metal elements composing the phosphor, preferably an alloy containing all the metal elements composing the phosphor, and then heating the alloy in a nitrogen-containing atmosphere under pressure. Alternatively, the phosphor may be produced by preparing an alloy containing some metal elements composing the phosphor, heating the alloy in a nitrogen-containing atmosphere under pressure, mixing the alloy with the raw material to be used as the source of the remaining metal element composing the phosphor, and then heating the mixture. The phosphor produced through an alloy contains less impurities and has high brightness.

The phosphor obtained as described above is preferably subjected to, as necessary, known surface treatment such as calcium phosphate treatment before dispersion in a resin.

[Combination with Other Phosphor]

The phosphor of the present invention is capable of developing a red color or an orange to red color through combination with a specific host crystal and an activating element. In cases where mixing with other colors such as a yellow, green, or blue color is necessary, the phosphor may be, as necessary, mixed with other inorganic phosphors developing these colors.

As described above, the emission wavelength and emission peak width of the phosphor of the general formula [11] can be adjusted by changing the proportion of solid-dissolved $M^{IV}_{(3n+2)/4}N_nO$, more specifically the value of x. The adjustment is conducted to achieve a required spectrum according to the intended use. In particular, the phosphor containing a $CaAlSiN_3$ phase and Eu at a ratio of $0.0001 \leq$ (number of Eu atoms)/{(number of Eu atoms)+(number of Ca atoms)}$\leq 0.1$ emit light having a peak in the wavelength from 550 nm to 700 nm upon excitation with light having a wavelength from 200 nm to 600 nm, and exhibits excellent luminescence properties as a high-brightness red phosphor. Accordingly, a phosphor exhibiting excellent luminescence properties and being adjustable for its emission wavelength and emission peak width is provided by solid-dissolving $Si_{(3n+2)/4}N_nO$ in the $CaAlSiN_3$:Eu phase in various proportions.

As described above, the phosphor of the general formula [21] is adjustable for its emission wavelength and emission peak width by changing the loading of Ce, the kind and/or loading of Ln as the second activator, and the proportion of oxygen ions. The adjustment is conducted to achieve a required spectrum according to the intended use.

As described above, the phosphors of the general formulae [31] and [41] are adjustable for their emission wavelength and emission peak width by changing the loading of the activator Eu and the proportion of solid-dissolved $AM^{IV}_2N_3$. The adjustment is conducted to achieve a required spectrum according to the intended use.

[Application of Phosphor]

In comparison with ordinary oxide phosphors and existing nitride or oxynitride phosphors, the phosphor of the present invention has a broader excitation range for electron beams and X-rays, and from ultraviolet light to visible light, emits orange and red light in the wavelength from 550 nm or more, specifically 570 nm or more, for example from 550 nm to 700 nm, and is adjustable for its emission wavelength and emission peak width. Owing to the luminescence properties, the phosphor of the present invention is suitable to light emitting devices, lighting systems, displays, pigments, and ultraviolet absorbing agents. In addition, the phosphor of the present invention does not deteriorate even when exposed to high temperatures, so that the phosphor is excellent in heat resistance, and exhibits excellent long-term stability in an oxidizing atmosphere and humid environment.

The excitation source may be ultraviolet light or visible light having a wavelength from 100 nm to 570 nm.

[Usage of Phosphor]

In cases where the phosphor of the present invention is used in a light emitting device, the phosphor is preferably used in the form of a dispersion in a liquid medium. The phosphor of the present invention may be used as a phosphor mixture containing the same. The dispersion of the phosphor of the present invention in a liquid medium is as appropriate referred to as "phosphor-containing composition".

The liquid medium for the phosphor-containing composition of the present invention may be freely selected according to the intended use, as long as it is a liquid, favorably disperses the phosphor of the present invention, and will not cause unfavorable reactions under the intended use conditions. Examples of the liquid medium include addition reacting silicone before curing, condensation reacting silicone, modified silicone, epoxy resins, polyvinyl resins, polyethylene resins, polypropylene resins, and polyester resins. These liquid media may be used alone, or in combination of two or more of them in an optional combination and ratio.

The amount of the liquid medium is appropriately adjusted according to the intended use or the like, and usually 3% by weight or more, and preferably 5% by weight or more, in addition, usually 30% by weight or less, and preferably 15% by weight or less in terms of the weight ratio of the liquid medium to the phosphor of the present invention.

The phosphor-containing composition of the present invention may contain, in addition to the phosphor of the present invention and liquid medium, other optional components according to the intended use or the like. Examples of other components include a diffusing agent, a thickening agent, a filler, and interfering agent. Specific examples thereof include silica-based fine powder such as AEROSIL and alumina.

[Light Emitting Device]

The light emitting device of the present invention is further described below. The light emitting device of the present invention is composed of at least a first illuminant, and a second illuminant which emits a visible light upon irradiation with the light from the first illuminant.

The first illuminant in the light emitting device of the present invention emits light which excites the below-described second illuminant. The emission wavelength of the first illuminant is not particularly limited as long as the wavelength overlaps with the below-described absorption wavelength of the second illuminant. Therefore, illuminants having various ranges of emission wavelength may be used. Usually, an illuminant having an emission wavelength from the near-ultraviolet to blue region is used. Specifically, an illuminant having an emission wavelength of usually 300 nm or more, preferably 330 nm or more, in addition, usually 500 nm or less is used. In particular, an ultraviolet (or violet) illuminant emitting light having a wavelength from 330 nm to 420 nm, and a blue illuminant emitting light having a wavelength from 420 nm to 500 nm is preferable.

The first illuminant is commonly a semiconductor light emitting device, and specific examples thereof include a light emitting diode (hereinafter appropriately abbreviated as "LED"), and a semiconductor laser diode (hereinafter appropriately abbreviated as "LD").

In particular, the first illuminant is preferably a GaN-based LED or LD composed of a GaN-based compound semiconductor. The reason is that a GaN-based LED or LD has a remarkably higher emission output and external quantum efficiency than a SiC-based LED emitting light in the region, and emits extremely bright light with a low power consumption through a combination with the phosphor. For example, under a current load of 20 mA, the GaN-based LED or LD usually exhibits an emission intensity more than 100 times the SiC-based one. The GaN-based LED or LD preferably has an $Al_xGa_yN$, GaN, or $In_xGa_yN$ luminescent layer. In particular, the GaN-based LED preferably has a multi-quantum well structure composed of an $In_xGa_yN$ layer and a GaN layer, because it exhibits an extremely high emission intensity.

The value of X+Y is usually from 0.8 to 1.2. In the GaN-based LED, the luminescent layer is preferably doped with Zn, Si, or no dopant from the viewpoint of controlling the luminescence properties.

The GaN-based LED is composed basically of the luminescent layer, a p layer, an n layer, an electrode, and a substrate, and preferably has a hetero structure in which the luminescent layer is sandwiched between $Al_xGa_yN$, GaN, or $In_xGa_yN$ layers of n type and p type thereby achieving a high emission efficiency, and more preferably the hetero structure is a multi-quantum well structure thereby achieving a even higher luminous efficiency.

The second illuminant in the light emitting device of the present invention contains one or more kinds of the phosphor of the present invention, and emits a visible light upon irradiation with the light from the first illuminant. According to the intended use, the second illuminant may appropriately contain one or more kinds of the below-described other phosphors (for example, a red phosphor, a yellow phosphor, a green phosphor, and a blue phosphor) thereby providing an intended luminescent color.

An example of the light emitting device of the present invention is the combination of an ultraviolet LED which emits light having a wavelength of 330 nm to 420 nm, a blue phosphor and a green phosphor which are excited at the wavelength and emit fluorescence having an emission peak at the wavelength from 420 nm to 500 nm and from 500 nm to 570 nm, respectively, and the phosphor of the present invention. In this case, the blue and green phosphor are, for example, $BaMgAl_{10}O_{17}$:Eu and $BaMgAl_{10}O_{17}$:Eu, Mn, respectively. In the light emitting device having the structure, the phosphors emit red, green, and blue lights upon irradiation with ultraviolet light emitted from the LED, and the lights are mixed to produce a white light.

Another example is the combination of a blue LED which emits light having a wavelength from 420 nm to 500 nm, a yellow phosphor which is excited at the wavelength and emits fluorescence having an emission peak at the wavelength from 550 nm to 600 nm, and the phosphor of the present invention. In this case, the yellow phosphor is, for example, $(Y, Gd)_3(Al, Ga)_5O_{12}$:Ce described in Patent Document 9 and α-sialon:Eu described in Patent Document 1. In particular, Ca-α-sialon in which Eu is solid-dissolved is preferable because it has high luminous brightness. In the light emitting device having the structure, the phosphors emit red and yellow lights upon irradiation with the blue light emitted from the LED, and the lights from the phosphors are mixed with the blue light from the LED to produce a warm white or reddish warm white light.

Still another example is the combination of a blue LED which emits light having a wavelength from 420 nm to 500 nm, a green phosphor which is emitted at the wavelength and emits fluorescence having an emission peak in the wavelength from 500 nm to 570 nm, and the phosphor of the present invention. In this case, the green phosphor is, for example, $Y_3Al_5O_{12}$:Ce. In the light emitting device having the structure, the phosphors emit red and green lights upon irradiation with the blue light emitted from the LED, and the lights from the phosphors are mixed with the blue light from the LED to produce a white light.

Still another example is the combination of a blue LED which emits light having the wavelength from 420 nm to 500 nm and the phosphor of the present invention. In the light emitting device having the structure, the phosphor of the present invention emits light upon irradiation with the blue light emitted from the LED, and the light from the phosphor is mixed with the blue light from the LED to produce a white light.

[Other Phosphors]

In the light emitting device of the present invention, the following phosphors may be used as the other phosphor.

Examples of the red phosphor include europium-activated alkaline earth silicon nitride phosphors expressed by (Mg, Ca, Sr, Ba)$_2$Si$_5$N$_8$:Eu, which are composed of broken particles having red broken surfaces and emit light in the red region, and europium-activated rare-earth oxychalcogenide phosphors expressed by (Y, La, Gd, Lu)$_2$O$_2$S:Eu, which are composed of grown particles having a nearly spherical shape as the regular crystal growth shape and emit light in the red region.

In addition, phosphors described in Japanese Patent Application Laid-Open No. 2004-300247, which contains an oxynitride and/or oxysulfide containing at least one element selected from the group consisting of Ti, Zr, Hf, Nb, Ta, W, and Mo, and contains an oxynitride having an alpha-sialon structure, in which the Al element is partially or entirely substituted by the Ga element, is also useful in the present embodiment. These phosphors contain an oxynitride and/or oxysulfide.

Other examples of the red phosphor include Eu-activated oxysulfide phosphors such as (La, Y)$_2$O$_2$S:Eu, Eu-activated oxide phosphors such as Y(V,P)O$_4$:Eu and Y$_2$O$_3$:Eu, Eu, Mn-activated silicate phosphors such as (Ba, Sr, Ca, Mg)$_2$SiO$_4$: Eu, Mn and (Ba, Mg)$_2$SiO$_4$:Eu, Mn, Eu-activated sulfide phosphors such as (Ca, Sr)S:Eu, Eu-activated aluminate phosphors such as YAlO$_3$:Eu, Eu-activated silicate phosphors such as LiY$_9$(SiO$_4$)$_6$O$_2$:Eu, Ca$_2$Y$_8$(SiO$_4$)$_6$O$_2$:Eu, (Sr, Ba, Ca)$_3$SiO$_5$:Eu, and Sr$_2$BaSiO$_5$:Eu, Ce-activated aluminate phosphors such as (Y, Gd)$_3$Al$_5$O$_{12}$:Ce and (Tb, Gd)$_3$Al$_5$O$_{12}$: Ce, Eu-activated nitride phosphors such as (Ca, Sr, Ba)$_2$Si$_5$N$_8$:Eu, (Mg, Ca, Sr, Ba)SiN$_2$:Eu, and (Mg, Ca, Sr, Ba)AlSiN$_3$:Eu, Ce-activated nitride phosphors such as (Mg, Ca, Sr, Ba)AlSiN$_3$:Ce, Eu, Mn-activated halophosphate phosphors such as (Sr, Ca, Ba, Mg)$_{10}$(PO$_4$)$_6$Cl$_2$:Eu, Mn, Eu, Mn-activated silicate salt phosphors such as (Ba$_3$Mg)Si$_2$O$_8$: Eu, Mn, and (Ba, Sr, Ca, Mg)$_3$(Zn, Mg) Si$_2$O$_8$: Eu, Mn, Mn-activated germanate phosphors such as 3.5MgO.0.5MgF$_2$.GeO$_2$:Mn, Eu-activated oxynitride phosphors such as Eu-activated α sialon, Eu, Bi-activated oxide phosphors such as (Gd, Y, Lu, La)$_2$O$_2$S:Eu, Bi, Eu, Bi-activated oxysulfide phosphors such as (Gd, Y, Lu, La)$_2$O$_2$S:Eu, Bi, Eu, Bi-activated vanadate phosphors such as (Gd, Y, Lu, La)VO$_4$:Eu, Bi, Eu, Ce-activated sulfide phosphors such as SrY$_2$S$_4$:Eu, Ce, Ce-activated sulfide phosphors such as CaLa$_2$S$_4$:Ce, Eu, Mn-activated phosphate phosphors such as (Ba, Sr, Ca)MgP$_2$O$_7$:Eu, Mn, and (Sr, Ca, Ba, Mg, Zn)$_2$P$_2$O$_7$: Eu, Mn, Eu, Mo-activated tungstate phosphors such as (Y, Lu)$_2$WO$_6$:Eu, Mo, Eu, Ce-activated nitride phosphors such as (Ba, Sr, Ca)$_x$Si$_y$N$_z$:Eu, Ce (x, y, and z are integral numbers not less than 1), Eu, Mn-activated halophosphate phosphors such as (Ca, Sr, Ba, Mg)$_{10}$(PO$_4$)$_6$(F, Cl, Br, OH):Eu, Mn, and Ce-activated silicate phosphors such as ((Y, Lu, Gd, Tb)$_{1-x}$Sc$_x$Ce$_y$)$_2$(Ca, Mg)$_{1-r}$(Mg, Zn)$_{2+r}$Si$_{z-q}$Ge$_q$O$_{12+δ}$.

As the red phosphor, also useful are red organic phosphors composed of a rare-earth element ion complex containing an anion ligand such as β-diketonate, β-diketone, aromatic carboxylic acid, or Broensted acid, perylene pigments (for example, dibenzo{[f,f']-4,4',7,7'-tetraphenyl}diindeno[1,2,3-cd:1',2',3'-lm]perylene), anthraquinone pigments, lake pigments, azo pigments, quinacridone pigments, anthracene pigments, isoindoline pigments, iso-indolinone pigments, phthalocyanine pigments, triphenylmethane basic dyes, indanthrone pigments, indophenol pigments, cyanine pigments, and dioxazine pigments.

Among the red phosphors, those having a peak wavelength of 580 nm or more, preferably 590 nm or more, in addition, 620 nm or less, preferably 610 nm or less is suitable as an orange phosphor. Examples of the orange phosphor include (Sr, Ba)$_3$SiO$_5$:Eu, (Sr, Mg)$_3$(PO$_4$)$_2$:Sn$^{2+}$, and (Sr, Ca)AlSiN$_3$: Eu.

Examples of the green phosphor include europium-activated alkaline earth silicon nitride phosphors expressed by (Mg, Ca, Sr, Ba)Si$_2$O$_2$N$_2$:Eu, which are composed of broken particles having broken surfaces and emit light in the green region, and europium-activated alkaline earth silicate phosphors expressed by (Ba, Ca, Sr, Mg)$_2$SiO$_4$:Eu, which are composed of broken particles having broken surfaces and emit light in the green region.

Other examples of the green phosphor include Eu-activated aluminate phosphors such as Sr$_4$Al$_{14}$O$_{25}$:Eu and (Ba, Sr, Ca)Al$_2$O$_4$:Eu, Eu-activated silicate salt phosphors such as (Sr, Ba)Al$_2$Si$_2$O$_8$:Eu, (Ba, Mg)$_2$SiO$_4$:Eu, (Ba, Sr, Ca, Mg)$_2$SiO$_4$:Eu, and (Ba, Sr, Ca)$_2$(Mg, Zn)Si$_2$O$_7$:Eu, Ce, Tb-activated silicate phosphors such as Y$_2$SiO$_5$:Ce, Tb, Eu-activated borate phosphate phosphors such as Sr$_2$P$_2$O$_7$—Sr$_2$B$_2$O$_5$:Eu, Eu-activated halosilicate phosphors such as Sr$_2$Si$_3$O$_8$-2SrCl$_2$:Eu, Mn-activated silicate phosphors such as Zn$_2$SiO$_4$:Mn, Tb-activated aluminate phosphors such as CeMgAl$_{11}$O$_{19}$:Tb and Y$_1$Al$_5$O$_{12}$:Tb, Tb-activated silicate phosphors such as Ca$_2$Y$_8$(SiO$_4$)$_8$O$_2$:Tb and La$_3$Ga$_5$SiO$_{14}$: Tb, Eu, Tb, Sm-activated thiogallate phosphors such as (Sr, Ba, Ca)Ga$_2$S$_4$:Eu, Tb, Sm, Ce-activated aluminate phosphors such as Y$_3$(Al, Ga)$_5$O$_{12}$:Ce and (Y, Ga, Tb, La, Sm, Pr, Lu)$_3$ (Al, Ga)$_5$O1$_2$:Ce, Ce-activated silicate phosphors such as Ca$_3$Sc$_2$Si$_3$O$_{12}$:Ce and Ca$_3$(Sc, Mg, Na, Li)$_2$Si$_3$O$_{12}$:Ce, Ce-activated oxide phosphors such as CaSc$_2$O$_4$:Ce, Eu-activated oxynitride phosphors such as SrSi$_2$O$_2$N$_2$:Eu, (Sr, Ba, Ca) Si$_2$O$_2$N$_2$: Eu, Eu-activated β-sialon, and Eu-activated α-sialon, Eu, Mn-activated aluminate phosphors such as BaMgAl$_{10}$O$_{17}$:Eu, Mn, Eu-activated aluminate phosphors such as SrAl$_2$O$_4$:Eu, Tb-activated oxysulfide phosphors such as (La, Gd, Y)$_2$O$_2$S:Tb, Ce, Tb-activated phosphate phosphors such as LaPO$_4$:Ce, Tb, sulfide phosphors such as ZnS: Cu, Al, ZnS:Cu, Au, Al, Ce, Tb-activated borate phosphors such as (Y, Ga, Lu, Sc, La)BO$_3$:Ce, Tb, Na$_2$Gd$_2$B$_2$O$_7$:Ce, Tb, and (Ba, Sr)$_2$(Ca, Mg, Zn)B$_2$O$_6$:K, Ce, Tb, Eu, Mn-activated halosilicate phosphors such as Ca$_8$Mg(SiO$_4$)$_4$Cl$_2$:Eu, Mn, Eu-activated thioaluminate phosphors and thiogallate phosphors such as (Sr, Ca, Ba)(Al, Ga, In)$_2$S$_4$:Eu, and Eu, Mn-activated halosilicate phosphors such as (Ca, Sr)$_8$(Mg, Zn) (SiO$_4$)$_4$Cl$_2$:Eu, Mn.

Alternatively, the green phosphor may be a pyridine-phthalimido condensate derivative, a fluorescent dye such as that based on benzooxazinone, quinazolinone, coumarin, quinophthalone, or a naphthalic acid imide, or an organic phosphor such as a terbium complex, for example, a terbium complex having a hexylsalicylate ligand.

Examples of the blue phosphor include europium-activated barium magnesium aluminate phosphors expressed by BaMgAl$_{10}$O$_{17}$:Eu, which are composed of grown particles having a nearly hexagonal shape as the regular crystal growth shape and emit light in the blue region, europium-activated calcium halophosphate phosphors expressed by (Ca, Sr, Ba)$_5$(PO$_4$)$_3$Cl:Eu, which are composed of grown particles having a nearly spherical shape as the regular crystal growth shape and emit light in the blue region, europium-activated alkaline each chloroborate phosphors expressed by (Ca, Sr, Ba)$_2$B$_5$O$_9$Cl:Eu, which are composed of grown particles having a nearly cubic shape as the regular crystal growth shape and emit light in the blue region, and europium-activated alkaline earth aluminate phosphors expressed by (Sr, Ca, Ba)Al$_2$O$_4$:Eu or (Sr, Ca, Ba)$_4$Al$_{14}$O$_{25}$:Eu, which are composed of broken particles having broken surfaces and emit light in the blue region.

Other examples of the blue phosphor include Sn-activated phosphate phosphors such as Sr$_2$P$_2$O$_7$:Sn, Eu-activated aluminate phosphors such as Sr$_4$Al$_{14}$O$_{25}$:Eu, BaMgAl$_{10}$O$_{17}$:Eu, and BaAl$_8$O$_{13}$:Eu, Ce-activated thiogallate phosphors such as SrGa$_2$S$_4$:Ce and CaGa$_2$S$_4$:Ce, Eu-activated aluminate phosphors such as (Ba, Sr, Ca)MgAl$_{10}$O$_{17}$:Eu and BaMgAl$_{10}$O$_{17}$: Eu, Tb, Sm, Eu, Mn-activated aluminate phosphors such as (Ba, Sr, Ca)MgAl$_{10}$O$_{17}$:Eu, Mn, Eu-activated halophosphate phosphors such as (Sr, Ca, Ba, Mg)$_{10}$(PO$_4$)$_6$Cl$_2$:Eu, and (Ba, Sr, Ca)$_5$(PO$_4$)$_3$(Cl, F, Br, OH):Eu, Mn, Sb, Eu-activated silicate phosphors such as BaAl$_2$Si$_2$O$_8$:Eu and (Sr, Ba)$_3$MgSi$_2$O$_8$:Eu, Eu-activated phosphate phosphors such as Sr$_2$P$_2$O$_7$:Eu, sulfide phosphors such as ZnS:Ag and ZnS:Ag, Al, Ce-activated silicate phosphors such as Y$_2$SiO$_5$:Ce, tungstate phosphors such as CaWO$_4$, Eu, Mn-activated borate phosphate phosphors such as (Ba, Sr, Ca)BPO$_5$:Eu, Mn, (Sr, Ca)$_{10}$(PO$_4$)$_6$.nB$_2$O$_3$:Eu, and 2SrO.0.84P$_2$O$_5$.0.16B$_2$O$_3$:Eu, and Eu-activated halosilicate phosphors such as Sr$_2$Si$_3$O$_8$.2SrCl$_2$:Eu.

Alternatively, the blue phosphor may be, for example, a fluorescent dye based on a naphthalic acid imide, benzoxazole, styryl, coumarin, pyrazoline, or triazole compound, or an organic phosphor such as a thulium complex.

The other phosphors may be used alone or in combination of two or more of them in an optional combination and ratio.

The average particle diameter of the phosphor particles is not particularly limited, but usually 100 nm or more, preferably 2 µm or more, particularly preferably 5 µm or more, in addition, usually 100 µm or less, preferably 50 µm or less, and particularly preferably 20 µm or less.

Figure 3:
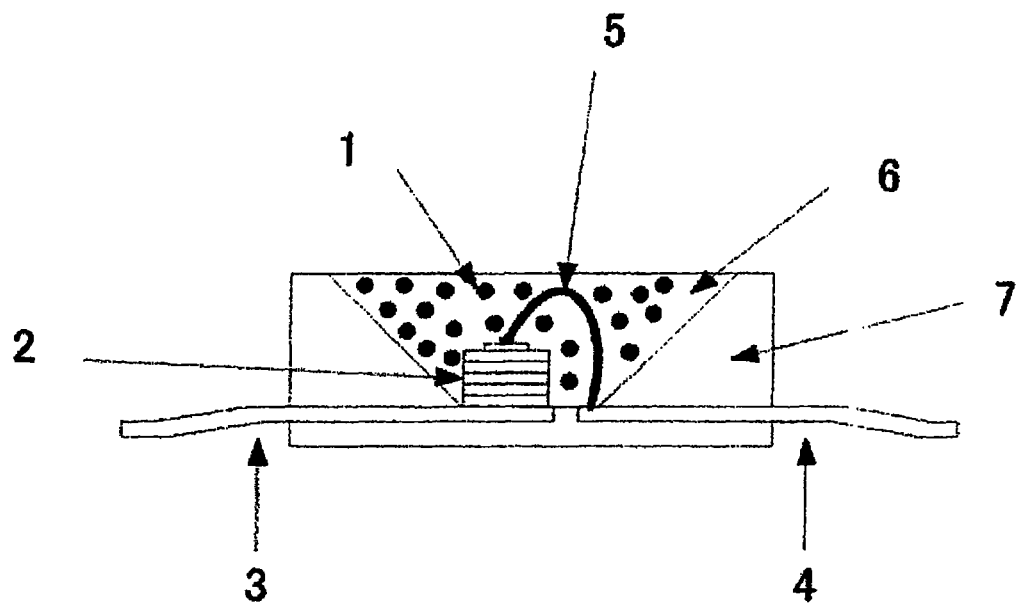
FIG. 3 is a schematic block diagram showing an embodiment of the lighting system (white LED) of the present invention.

FIG. 3 shows a schematic structural drawing of a white light emitting device as a lighting system, which is an example of the embodiment of the lighting system of the present invention.

Numeral 1 denotes phosphor, for example, a mixture of the phosphor of the present invention, a blue phosphor, and a green phosphor, a mixture of the phosphor of the present invention and a green phosphor, or a mixture of the phosphor of the present invention and a yellow phosphor. The lighting system shown in FIG. 3 is composed of the phosphor 1 dispersed in a resin layer 6, the resin layer 6 covering a LED 2 serving as a luminescent light source disposed in a vessel 7. The LED 2 is directly connected onto the conductive terminal 3, and is also connected to another conductive terminal 4 through a wire bond 5.

When an electric current flows through the conductive terminals 3,4, the LED 2 a emits predetermined light, the light excites the phosphor 1 to emit fluorescence, and the light from the LED and fluorescence, or fluorescences are mixed, and thus the lighting system emits a white to warm white light.

[Display]

The display of the present invention is composed of at least an excitation source and the phosphor of the present invention, and preferably has a color filter as a component. Examples of the display include a vacuum fluorescent display (VFD), a field emission display (FED), a plasma display panel (PDP), and a cathode ray tube.

It is confirmed that the phosphor of the present invention emit light upon excitation with vacuum ultraviolet light having a wavelength from 100 nm to 190 nm, ultraviolet light having a wavelength from 190 nm to 380 nm, or an electron beam. The above-described display is composed of one of these excitation sources and the phosphor of the present invention.

Figure 4:
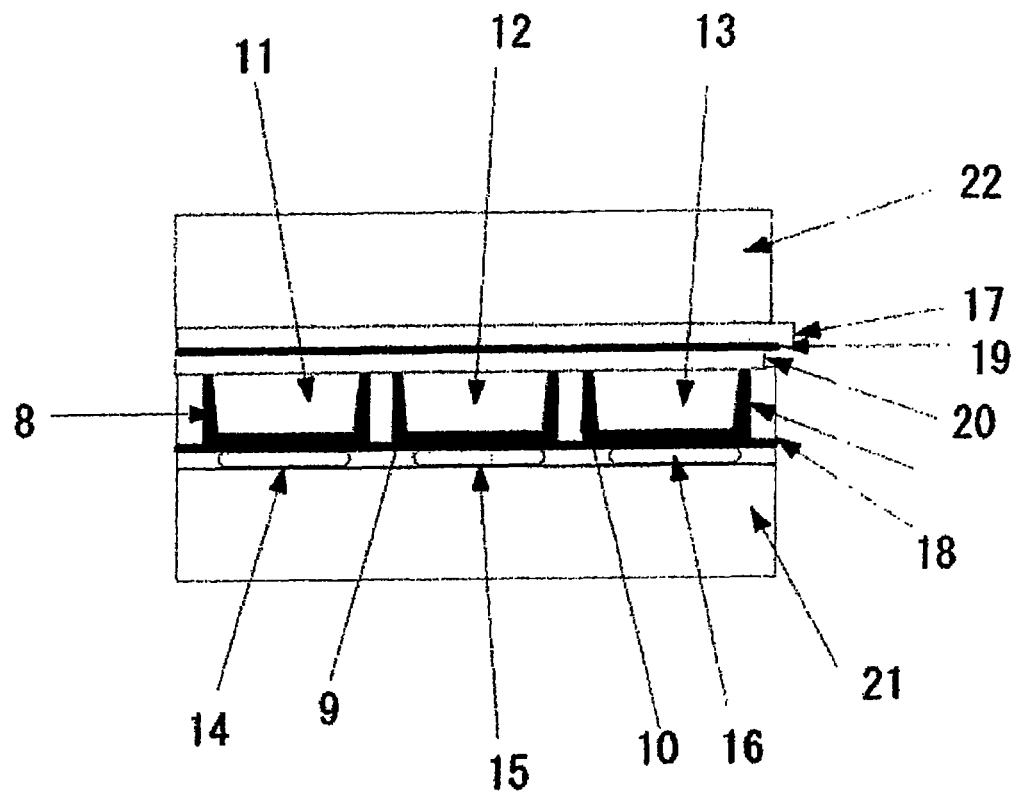
FIG. 4 is a schematic block diagram showing an embodiment of the display (PDP) of the present invention.

FIG. 4 shows a schematic block diagram of a PDP as a display, which is an embodiment of the display of the present invention. In the PDP, the phosphor of the present invention 8, a green phosphor 9, and a blue phosphor 10 are applied to the inner surfaces of the cells 11, 12, and 13, respectively. When an electric current flows between the electrodes 14, 15, and 16 and the electrode 17, vacuum ultraviolet light is generated by Xe discharge in the cells 11, 12, and 13, in turn the phosphors 8 to 10 are excited to emit red, green, and blue visible lights, and the lights are observed from the outside through a protective layer 20, a dielectric layer 19, and a glass substrate 22. Thus the device serves as a display. Numerals 18 and 21 denote a dielectric layer and a glass substrate on the back side, respectively.

[Pigment]

The phosphor of the present invention composed of an inorganic compound crystal phase having a specific chemical composition has a red matrix color, and is thus useful as a red pigment or a red fluorescence pigment. More specifically, when the phosphor of the present invention is irradiated solar light or an illuminating lamp such as a fluorescent lamp, the red body color is observed. The color is favorably developed, and does not deteriorate over a long period of time. Accordingly, the phosphor of the present invention is suitable for a red inorganic pigment. Therefore, when the phosphor is used in a coloring agent added to paints, inks, coloring matters, glazes, or plastic products, good color development is maintained at a high level over a long period of time.

[Ultraviolet Absorbing Agent]

The nitride phosphor of the present invention is suitable as an ultraviolet absorbing agent for absorbing ultraviolet light. Therefore, when the phosphor is used as a paint, or applied onto or kneaded into a plastic product, ultraviolet light is effectively blocked, and thus the product is effectively protected against ultraviolet deterioration.

EXAMPLES

The present invention is illustrated with reference to the following Examples, but the present invention is not limited to the following Examples without departing from the scope of the invention.

Examples and Comparative Examples of Phosphors Containing Crystal Phase [11]

The following Examples and Comparative Examples used the raw material powders listed below.

Silicon nitride (Si$_3$N$_4$) powder, average particle diameter: 0.5 µm, oxygen content: 0.93% by weight, α-type content: 92%

Aluminum nitride (AlN) powder, specific surface area: 3.3 m$^2$/g, oxygen content 0.79% by weight Calcium nitride (Ca$_3$N$_2$) powder Alumina (Al$_2$O$_3$) powder Europium nitride (EuN) powder synthesized by nitriding metal europium in ammonia Silicon dioxide (SiO$_2$) powder Europium oxide (Eu$_2$O$_3$) powder Examples I-1 to I-11, Comparative Examples I-1 to I-5

In order to obtain compounds having the theoretical composition formulae listed in Table 4, each of the raw material powders listed in Table 4 was taken at the weight (g) listed in Table 4, and mixed for 10 minutes using a pestle and mortar made of agate. Thereafter, the mixture was filled in a boron nitride crucible (volume filling rate: 38%). All the operations from weighing to mixing the powders were conducted in a glove box capable of keeping a nitrogen atmosphere having a moisture content of 1 ppm or less and an oxygen content of 1 ppm or less.

The powder mixture was placed in a boron nitride crucible, and mounted on an electric furnace of graphite resistance heating type. The firing operation was conducted as follows: the firing atmosphere was vacuumized by a diffusion pump, the temperature was increased from room temperature to 800° C. at a ratio of 500° C. per hour, nitrogen having a purity of 99.999% by volume was introduced at the temperature of 800° C. to raise the pressure to 0.5 Mpa, the temperature was increased to the firing temperature listed in Table 4 at a ratio of 500° C. per hour, and the firing temperature listed in Table 4 was maintained for 2 hours. After the firing operation, the fired product was coarsely pulverized, then manually pulverized using a crucible and a mortar made of a silicon nitride sintered body, and thus a phosphor powder was obtained.

The substance obtained by the firing operation has the theoretical chemical formula shown in Table 4. The substance was $Eu_{y(1-x)}Ca_{(1-y)(1-x)}Al_{1-x}Si_{1+x}N_{3-x}O_x$ expressed by the general formula [11], wherein x and y are values corresponding to the charged raw materials.

The composition analysis of the obtained substance was conducted as follows.

50 mg of the sample was placed in a platinum crucible, 0.5 g of sodium carbonate and 0.2 g of boric acid were added and thermally fused, and the melt was dissolved in 2 ml of hydrochloric acid to obtain 100 ml of a test solution. The liquid sample was subjected to ICP emission spectral analysis thereby determining the amount of Si, Al, Eu, and Ca in the powder sample. In addition, 20 mg of the sample was placed in a tin capsule, the capsule was placed in a nickel basket, and then subjected to a TC-436 oxygen/nitrogen analyzer manufactured by LECO Corporation thereby determined the amount of oxygen and nitrogen in the powder sample.

TABLE 4

| Example or Comparative Example | Charged weight of raw materials (g) | | | | | | | Firing temperature (° C.) | Theoretical chemical formula of resultant substance |
|---|---|---|---|---|---|---|---|---|---|
| | EuN | $Eu_2O_3$ | $Ca_3N_2$ | $Si_3N_4$ | $SiO_2$ | AlN | $Al_2O_3$ | | |
| Example I-1 | 0 | 0.0212 | 0.5178 | 0.8673 | 0.1592 | 0.4344 | 0 | 1800 | $Eu_{0.008}Ca_{0.662}Al_{0.67}Si_{1.33}N_{2.67}O_{0.33}$ |
| Example I-2 | 0.02 | 0 | 0.5182 | 0.9919 | 0 | 0.2898 | 0.1802 | 1900 | $Eu_{0.008}Ca_{0.662}Al_{0.67}Si_{1.33}N_{2.67}O_{0.33}$ |
| Example I-3 | 0.0195 | 0 | 0.6525 | 0.7754 | 0 | 0.4953 | 0.0574 | 1900 | $Eu_{0.008}Ca_{0.882}Al_{0.89}Si_{1.11}N_{2.89}O_{0.11}$ |
| Example I-4 | 0 | 0.0592 | 0.4992 | 0.9782 | 0 | 0.2858 | 0.1778 | 2000 | $Eu_{0.023}Ca_{0.647}Al_{0.67}Si_{1.33}N_{2.67}O_{0.33}$ |
| Example I-5 | 0.02 | 0 | 0.5182 | 0.9919 | 0 | 0.2898 | 0.1802 | 2000 | $Eu_{0.008}Ca_{0.662}Al_{0.67}Si_{1.33}N_{2.67}O_{0.33}$ |
| Example I-6 | 0.0195 | 0 | 0.6525 | 0.7754 | 0 | 0.4953 | 0.0574 | 2000 | $Eu_{0.008}Ca_{0.882}Al_{0.89}Si_{1.11}N_{2.89}O_{0.11}$ |
| Example I-7 | 0.02 | 0 | 0.5181 | 0.8679 | 0.1593 | 0.4347 | 0 | 1800 | $Eu_{0.008}Ca_{0.662}Al_{0.67}Si_{1.33}N_{2.67}O_{0.33}$ |
| Example I-8 | 0.02 | 0 | 0.5182 | 0.8679 | 0.1593 | 0.4347 | 0 | 1900 | $Eu_{0.008}Ca_{0.662}Al_{0.67}Si_{1.33}N_{2.67}O_{0.33}$ |
| Example I-9 | 0.02 | 0 | 0.5182 | 0.8679 | 0.1593 | 0.4347 | 0 | 2000 | $Eu_{0.008}Ca_{0.662}Al_{0.67}Si_{1.33}N_{2.67}O_{0.33}$ |
| Example I-10 | 0 | 0.0212 | 0.5178 | 0.9913 | 0 | 0.2897 | 0.1801 | 2000 | $Eu_{0.008}Ca_{0.662}Al_{0.67}Si_{1.33}N_{2.67}O_{0.33}$ |
| Example I-11 | 0 | 0.0212 | 0.5178 | 0.8673 | 0.1592 | 0.4344 | 0 | 1800 | $Eu_{0.008}Ca_{0.662}Al_{0.67}Si_{1.33}N_{2.67}O_{0.33}$ |
| Comparative Example I-1 | 0.0193 | 0 | 0.7099 | 0.6772 | 0 | 0.5936 | 0 | 1800 | $Eu_{0.008}Ca_{0.992}AlSiN_3$ |
| Comparative Example I-2 | 0.0193 | 0 | 0.71 | 0.6772 | 0 | 0.5936 | 0 | 1900 | $Eu_{0.008}Ca_{0.992}AlSiN_3$ |
| Comparative Example I-3 | 0.0193 | 0 | 0.71 | 0.6772 | 0 | 0.5936 | 0 | 2000 | $Eu_{0.008}Ca_{0.992}AlSiN_3$ |
| Comparative Example I-4 | 0 | 0.0204 | 0.7095 | 0.6768 | 0 | 0.5933 | 0 | 2000 | $Eu_{0.008}Ca_{0.992}AlSiN_3$ |
| Comparative Example I-5 | 0.0192 | 0 | 0.71 | 0.6772 | 0 | 0.5936 | 0 | 1800 | $Eu_{0.008}Ca_{0.992}AlSiN_3$ |

The indices assigned to the peaks in the XRD patterns of the phosphors are listed in Table 2. Table 2 indicates that: the calculated values of 2θ, which are determined from the plane indices in consideration of the shifts of the lattice constants, are in approximate agreement with the observed values; the crystal maintains the space group $Cmc2_1$, or an orthorhombic system; and solid solutions having a $CaAlSiN_3$ structure are formed.

In the phosphors obtained in the above Examples, the alkaline earth metal elements contained in the phosphors are substituted by elements having a lower valence than the alkaline earth metal elements or vacancies, or the rare-earth metal elements contained in the phosphors are substituted by elements having a lower valence than the rare-earth metal elements or vacancies.

In the phosphors obtained in Comparative Example, the alkaline earth metal elements contained in the phosphors are not substituted by elements having a lower valence than the alkaline earth metal elements or vacancies, or the rare-earth metal elements contained in the phosphors are not substituted by elements having a lower valence than the rare-earth metal elements or vacancies.

Figure 2:
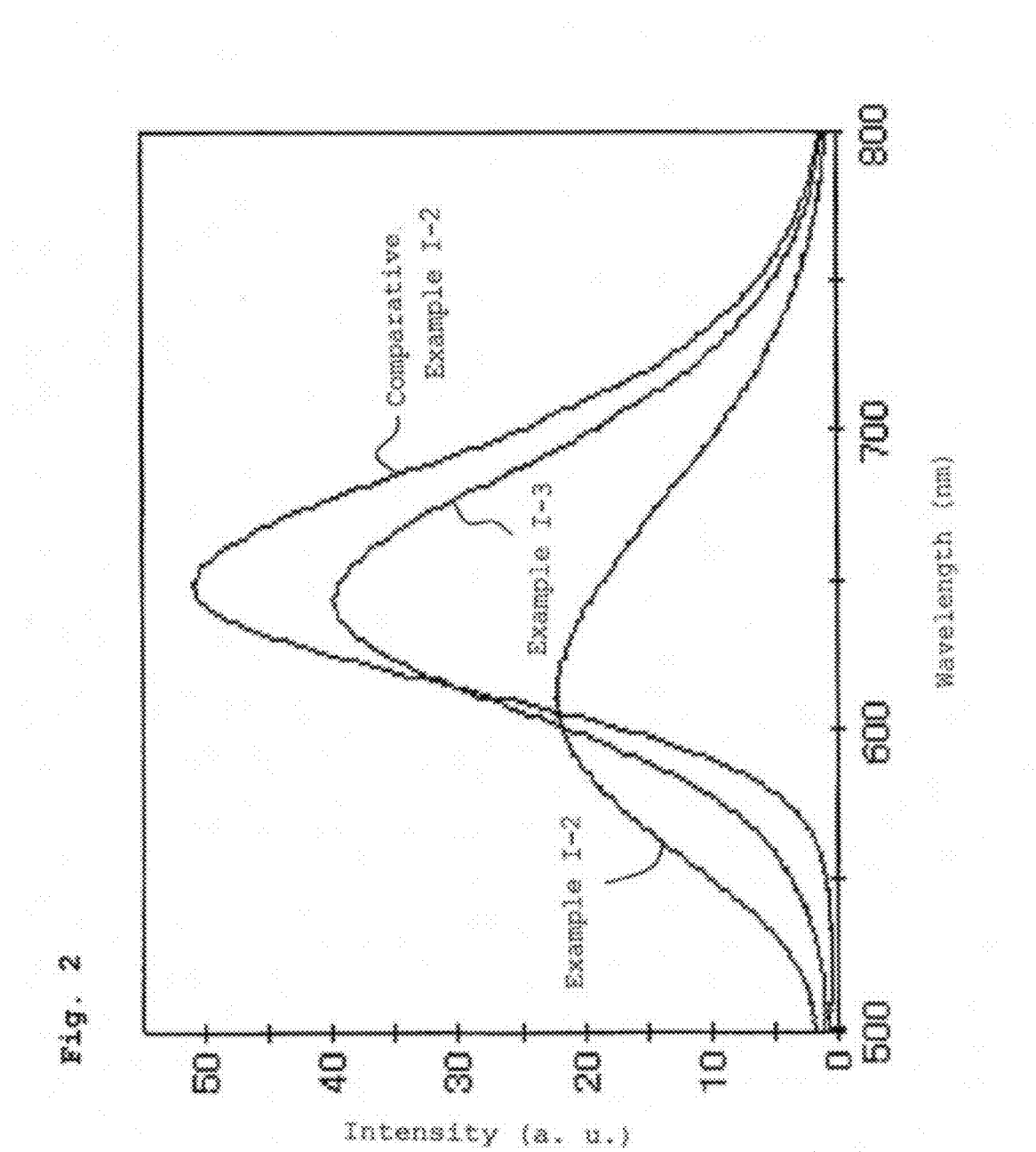
FIG. 2 shows emission spectra of the phosphors of Examples I-2 (x=0.33) and I-3 (x=0.11), and Comparative Example I-2 (x=0) upon excitation at 465 nm.

The emission spectra of the phosphors in which x=0 (Comparative Example I-2), x=0.11 (Example I-3), or x=0.33 (Example I-2) upon excitation at 465 nm are shown in FIG. 2.

The phosphors were excited with a lamp emitting light having a wavelength of 465 nm, and the emission spectra were measured using a fluorescence spectrophotometer. Table 5 lists the emission peak wavelengths and the relative brightness determined taking the luminous brightness of the phosphor of Comparative Example I-3 as 100.

For the phosphors of Examples I-6, I-9, and Comparative Example I-3, the ratio of the excitation intensity (peak value in the emission spectrum) at the green light wavelength of 535 nm to the excitation intensity (peak value in the emission spectrum) at the wavelength of 465 nm was determined, and the results are listed in Table 5.

TABLE 5

| Example or Comparative Example | x and y in $(Eu_yCa_{1-y}AlSiN_3)_{1-x}(Si_2N_2O)_x$ | | Synthesis conditions | | | Properties of emission spectrum upon excitation at 465 nm | | Ratio of excitation intensity at the green light wavelength of 535 nm to excitation intensity at 465 nm |
|---|---|---|---|---|---|---|---|---|
| | Proportion of solid-dissolved $Si_2N_2O_x$ | molar ratio $y(1-x)$ | Firing temperature (° C.) | Oxygen source | Activating element source | Relative brightness | Emission wavelength (nm) | |
| Example I-1 | 0.33 | 0.008 | 1800 | $Al_2O_3$ | EuN | 136 | 607 | |
| Comparative Example I-1 | 0 | 0.008 | 1800 | なし | EuN | 94 | 650 | |
| Example I-2 | 0.33 | 0.008 | 1900 | $Al_2O_3$ | EuN | 144 | 610 | |
| Example I-3 | 0.11 | 0.008 | 1900 | $Al_2O_3$ | EuN | 119 | 644 | |
| Comparative Example I-2 | 0 | 0.008 | 1900 | なし | EuN | 97 | 648 | |
| Example I-4 | 0.33 | 0.023 | 2000 | $Al_2O_3$ | EuN | 127 | 643 | |
| Example I-5 | 0.33 | 0.008 | 2000 | $Al_2O_3$ | EuN | 168 | 614 | |
| Example I-6 | 0.11 | 0.008 | 2000 | $Al_2O_3$ | EuN | 128 | 642 | 0.76 |
| Comparative Example I-3 | 0 | 0.008 | 2000 | なし | EuN | 100 | 648 | 0.84 |
| Example I-7 | 0.33 | 0.008 | 1800 | $SiO_2$ | EuN | 148 | 619 | |
| Comparative Example I-1 | 0 | 0.008 | 1800 | なし | EuN | 94 | 650 | |
| Example I-8 | 0.33 | 0.008 | 1900 | $SiO_2$ | EuN | 150 | 606 | |
| Comparative Example I-2 | 0 | 0.008 | 1900 | なし | EuN | 97 | 648 | |
| Example I-9 | 0.33 | 0.008 | 2000 | $SiO_2$ | EuN | 157 | 613 | 0.44 |
| Comparative Example I-3 | 0 | 0.008 | 2000 | なし | EuN | 100 | 648 | 0.84 |
| Example I-10 | 0.33 | 0.008 | 2000 | $Al_2O_3$ | $Eu_2O_3$ | 152 | 612 | |
| Comparative Example I-4 | 0 | 0.008 | 2000 | なし | $Eu_2O_3$ | 96 | 646 | |
| Example I-11 | 0.33 | 0.008 | 1800 | $SiO_2$ | $Eu_2O_3$ | 136 | 607 | |
| Comparative Example I-5 | 0 | 0.008 | 1800 | なし | $Eu_2O_3$ | 82 | 652 | |

These results indicates that the phosphors composed of solid-dissolved $Si_2N_2O$ exhibits a more remarkable shift of the peak wavelength of the red light, and higher relative brightness at all the firing temperatures of 1800° C., 1900° C., and 2000° C., and regardless whether the activating element source is EuN or $Eu_2O_3$, and whether the oxygen source is $Al_2O_3$ or $SiO_2$.

From the comparison of the excitation spectra of Examples I-6, I-9, and Comparative Example I-3, which had been fired at 2000° C., it was found that the ratio of the excitation intensity at the green light wavelength of 535 nm to the excitation intensity at the blue LED wavelength of 465 nm was lower for the system containing solid-dissolved $Si_2N_2O$ at a ratio of 33% (x=0.33) than the system containing no $Si_2N_2O$, which indicates that, in the white optical device composed of the blue LED, green phosphor, and red phosphor, the system containing the solid-dissolved $Si_2N_2O$ scarcely excites the green light from the green phosphor, or scarcely loses the green light.

Examples I-12 to I-22

In Examples I-12 to I-22, $Si_{(3n+2)/4}N_nO$ was used in place of $Si_2N_2O$

In Examples I-12 to I-22, phosphors expressed by $(Eu_{0.008/(1-x)}Ca_{(0.008/(1-x))}AlSiN_3)_{1-x}(Si_{(3n+2)/4}N_nO)_x$, wherein n and x differ among the phosphors, were produced and tested in the same manner as Example I-1.

The thus obtained phosphors were excited with a lamp emitting light having a wavelength of 465 nm, and the emission spectrum was measured using a fluorescence spectrophotometer. Table 6 lists the emission peak wavelengths and the relative brightness determined taking the luminous brightness of the phosphor of Comparative Example I-3 as 100.

Table 6 also includes the values of Example I-9 and Comparative Examples I-3 and I-5.

In the phosphors obtained in the above Examples, the alkaline earth metal elements contained in the phosphors are substituted by elements having a lower valence than the alkaline earth metal elements or vacancies, or the rare-earth metal elements contained in the phosphors are substituted by elements having a lower valence than the rare-earth metal elements or vacancies.

TABLE 6

Figure 7:
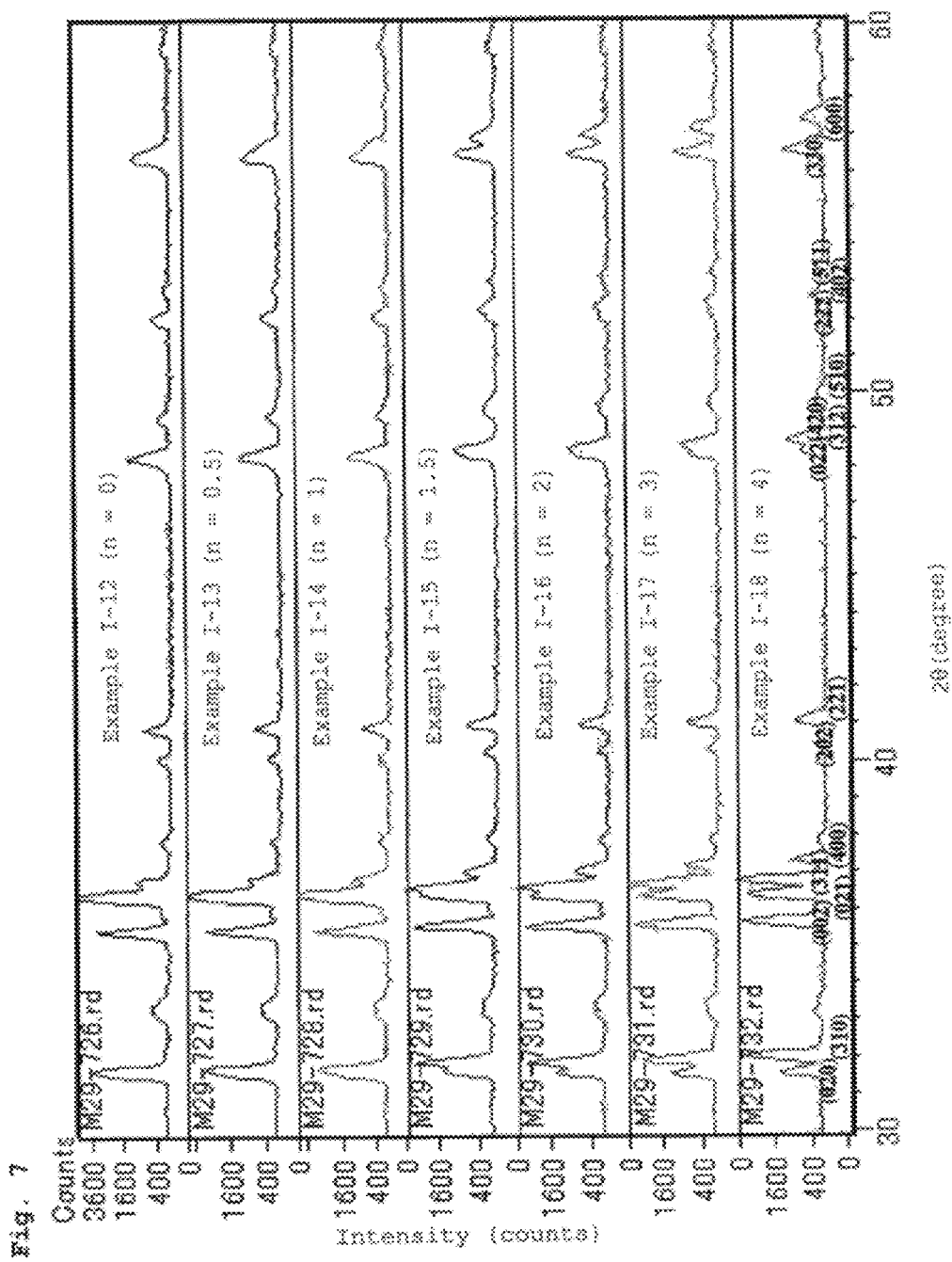
FIG. 7 shows XRD patterns of the substances $(Eu_{0.009}Ca_{0.991}AlSiN_3)_{0.89}(Si_{(3n+2)/4}N_nO)_{0.11}$, wherein n=0, 0.5, 1.0, 1.5, 2.0, 3.0, and 4.0.
Figure 8:
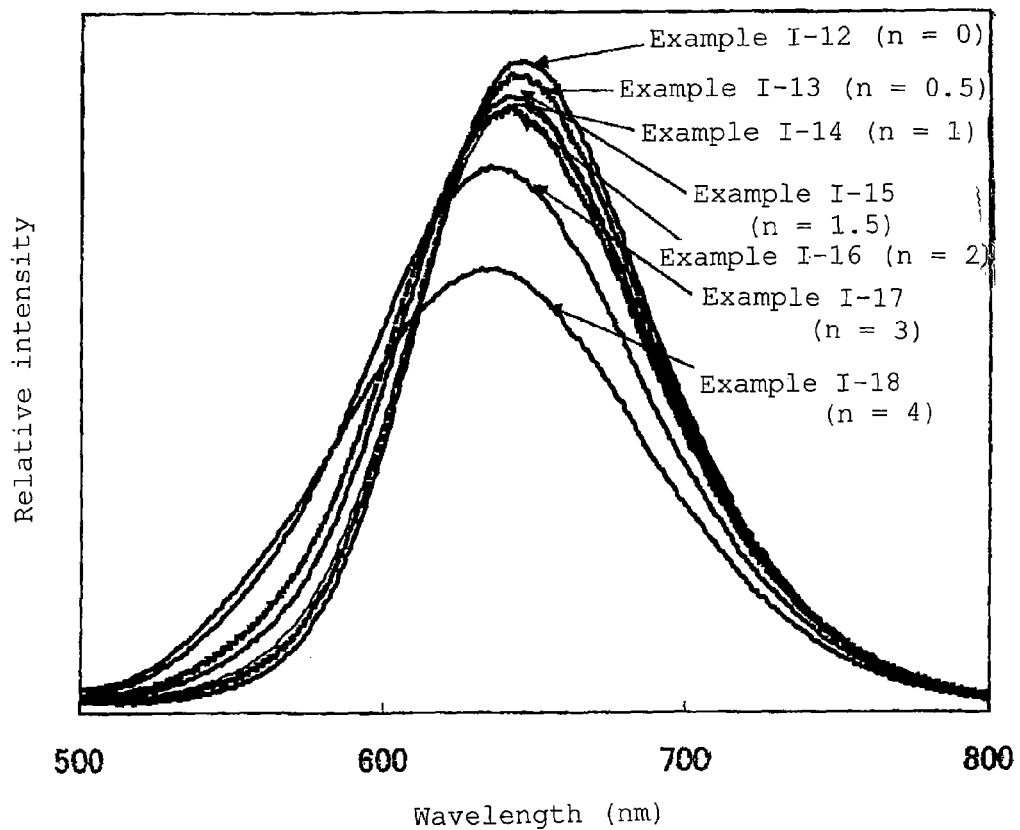
FIG. 8 shows emission spectra of the substances $(Eu_{0.009}Ca_{0.991}AlSiN_3)_{0.89}(Si_{(3n+2)/4}N_nO)_{0.11}$, wherein n=0, 0.5, 1.0, 1.5, 2.0, 3.0, and 4.0, upon excitation at 465 nm.
Figure 9:
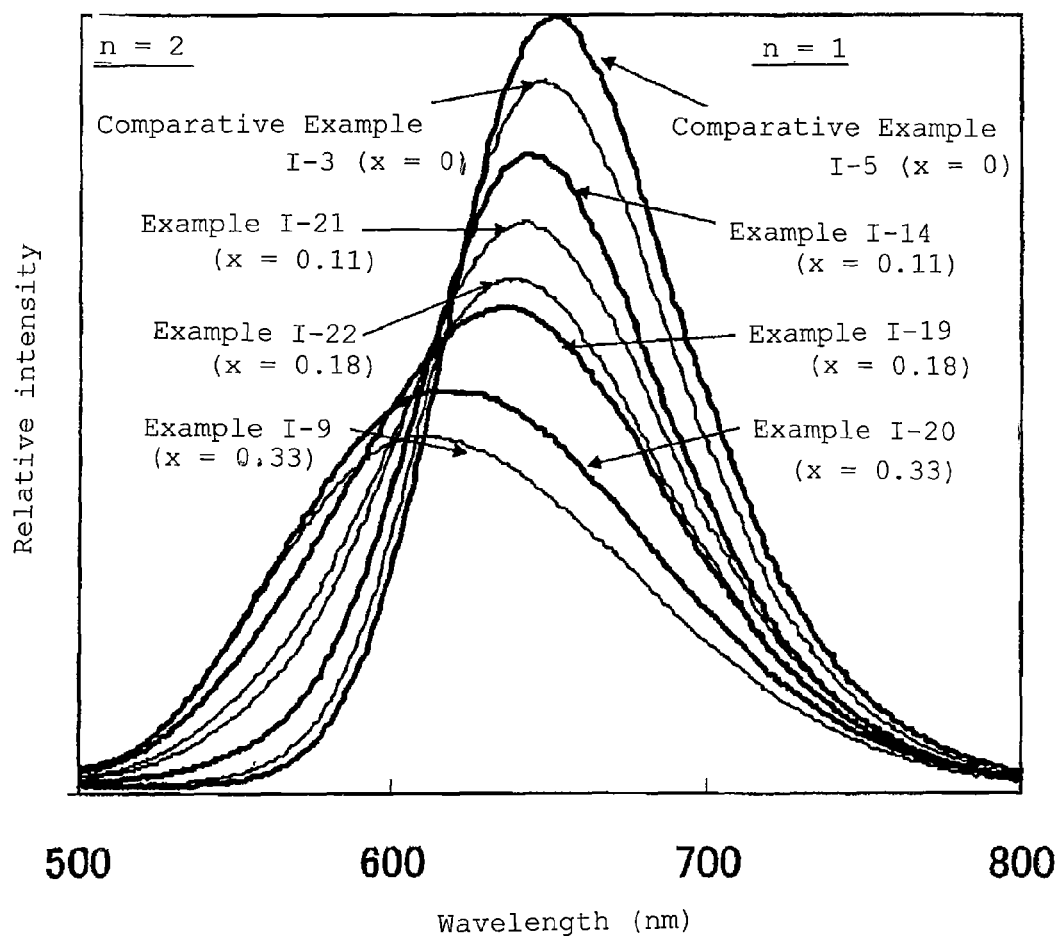
FIG. 9 shows emission spectra of the substances $(Eu_{0.008(1-x)}Ca_{(1-0.008/(1-x))}CaAlSiN_3)_{1-x}(Si_{1.25}NO)_x$ and $(Eu_{0.008(1-x)}Ca_{(1-0.008/(1-x))}AlSiN_3)_{1-x}(Si_2N_2O)_x$, in which n=0, 0.11, 0.18, and 0.33, upon excitation at 465 nm.

| Example or Comparative Example | n and x in the formula $(Eu_{0.008y(1-x)}Ca_{(1-0.008y)(1-x)}AlSiN_3)_{1-x}(Si_{(3n+2)/4}N_nO)_x$ | | Synthesis conditions | | | Properties of emission spectrum upon excitation at 465 nm | | Remark |
|---|---|---|---|---|---|---|---|---|
| | n | x | Firing temperature (°C.) | Oxygen source | Activating element source | Relative brightness | Emission wavelength (nm) | |
| Example I-12 | 0 | 0.11 | 1800 | $Al_2O_3$ | $Eu_2O_3$ | 107 | 646 | Data of FIGS. 7 and 8 |
| Example I-13 | 0.5 | 0.11 | 1800 | $Al_2O_3$ | $Eu_2O_3$ | 113 | 642 | |
| Example I-14 | 1 | 0.11 | 1800 | $Al_2O_3$ | $Eu_2O_3$ | 117 | 642 | |
| Example I-15 | 1.5 | 0.11 | 1800 | $Al_2O_3$ | $Eu_2O_3$ | 132 | 642 | |
| Example I-16 | 2 | 0.11 | 1800 | $Al_2O_3$ | $Eu_2O_3$ | 142 | 642 | |
| Example I-17 | 3 | 0.11 | 1800 | $Al_2O_3$ | $Eu_2O_3$ | 162 | 637 | |
| Example I-18 | 4 | 0.11 | 1800 | $Al_2O_3$ | $Eu_2O_3$ | 155 | 636 | |
| Example I-14 | 1 | 0.11 | 1800 | $Al_2O_3$ | $Eu_2O_3$ | 117 | 642 | Data of FIG. 9 |
| Example I-19 | 1 | 0.18 | 1800 | $Al_2O_3$ | $Eu_2O_3$ | 143 | 639 | |
| Example I-20 | 1 | 0.33 | 1800 | $Al_2O_3$ | $Eu_2O_3$ | 170 | 617 | |
| Comparative Example I-5 | 1 | 0 | 1800 | なし | $Eu_2O_3$ | 82 | 652 | |
| Example I-21 | 2 | 0.11 | 2000 | $SiO_2$ | EuN | 135 | 642 | |
| Example I-22 | 2 | 0.18 | 2000 | $SiO_2$ | EuN | 161 | 636 | |
| Example I-9 | 2 | 0.33 | 2000 | $SiO_2$ | EuN | 157 | 613 | |
| Comparative Example I-3 | 2 | 0 | 2000 | なし | EuN | 100 | 648 | |

FIG. 7 shows the results of X-ray diffraction (XRD patterns) of the phosphors obtained in Examples I-12 to I-18.

These results indicate that the phosphors having the compositions in which n=0, 0.5, 1, 1.5, 2, 3, and 4 have the same crystal structure.

FIG. 8 shows the emission spectra of the phosphors obtained in Examples I-12 to I-18.

In these Examples, x and y are fixed at 0.11 and 0.008, respectively.

FIG. 8 indicates that the peak wavelength shifted toward short wavelength side, and the half width increased with the increase of n.

FIG. 9 shows emission spectra of the phosphors, in which n=2 and 1, and x=0.11, 0.18, and 0.33, upon excitation with light having a wavelength of 465 nm. (Examples I-9, I-14, and I-19 to I-22). For reference, the spectra of the phosphors in which x=0 (Comparative Examples I-3 and I-5) are also shown in FIG. 9. FIG. 9 indicates that the peak wavelength shifted toward short wavelength side, and the half width increased with the increase of x, and that n=2 was more effective than n=1.

Examples and Comparative Examples of Phosphors Containing Crystal Phase [21]

The following Examples and Comparative Example used the raw material powders listed below.

Silicon nitride ($Si_3N_4$) powder, average particle diameter: 0.5 μm, oxygen content: 0.93% by weight, α-type content: 92%

Aluminum nitride (AlN) powder, specific surface area: 3.3 $m^2/g$, oxygen content 0.79% by weight Calcium nitride ($Ca_3N_2$) powder Alumina ($Al_2O_3$) powder Europium nitride (EuN) powder synthesized by nitriding metal europium in ammonia Cerium dioxide ($CeO_2$) powder Examples II-1 to II-10, Comparative Examples II-1 to II-3

In order to obtain compounds having the theoretical composition formulae listed in Table 4, each of the raw material powders listed in Table 7 was taken at the weight (g) listed in Table 7, and mixed for 10 minutes using a pestle and mortar made of agate. Thereafter, the mixture was filled in a boron nitride crucible having an inner diameter of 20 mm and an inside height of 20 mm. All the operations from weighing to mixing the powders were conducted in a glove box capable of keeping a nitrogen atmosphere having a moisture content of 1 ppm or less and an oxygen content of 1 ppm or less.

The powder mixture was placed in a boron nitride crucible, and mounted on an electric furnace of graphite resistance heating type. The firing operation was conducted as follows: the firing atmosphere was vacuumized by a diffusion pump, the temperature was increased from room temperature to 800° C. at a ratio of 500° C. per hour, nitrogen having a purity of 99.999% by volume was introduced at the temperature of 800° C. to raise the pressure to 0.5 Mpa, the temperature was increased to the firing temperature listed in Table 4 at a ratio of 500° C. per hour, and the firing temperature listed in Table 4 was maintained for 2 hours. After the firing operation, the fired product was coarsely pulverized, then manually pulverized using a crucible and a mortar made of a silicon nitride sintered body, and thus a phosphor powder was obtained.

The substance obtained by the firing operation has the theoretical chemical formula shown in Table 7. The substance is expressed by the general formula [21], wherein n=2, and x, y(1−x), z(1−x) had values listed in Table 8, corresponding to the charged raw materials.

The composition analysis of the obtained substance was conducted as follows.

50 mg of the sample was placed in a platinum crucible, 0.5 g of sodium carbonate and 0.2 g of boric acid were added and thermally fused, and the melt was dissolved in 2 ml of hydrochloric acid to obtain 100 ml of a test solution. The liquid sample was subjected to ICP emission spectral analysis thereby determining the amount of Si, Al, Eu, and Ca in the powder sample. In addition, 20 mg of the sample was placed in a tin capsule, the capsule was placed in a nickel basket, and then subjected to a TC-436 oxygen/nitrogen analyzer manufactured by LECO Corporation thereby determined the amount of oxygen and nitrogen in the powder sample.

TABLE 7

| | | Charged weight of raw materials (g) | | | | | Theoretical chemical formula of |
| --- | --- | --- | --- | --- | --- | --- | --- |
| | | $CeO_2$ | EuN | $Ca_3N_2$ | $Si_3N_4$ | AlN | $Al_2O_3$ | resultant substance |
| Examples | II-1 | 0.081939 | 0 | 0.579323 | 0.820885 | 0.426843 | 0.091011 | $Ce_{0.032}Ca_{0.788}Al_{0.82}Si_{1.18}N_{2.82}O_{0.18}$ |
| | II-2 | 0.101682 | 0 | 0.569284 | 0.814934 | 0.423749 | 0.090351 | $Ce_{0.04}Ca_{0.78}Al_{0.82}Si_{1.18}N_{2.82}O_{0.18}$ |
| | II-3 | 0.12114 | 0 | 0.559391 | 0.80907 | 0.420699 | 0.089701 | $Ce_{0.048}Ca_{0.772}Al_{0.82}Si_{1.18}N_{2.82}O_{0.18}$ |
| | II-4 | 0.051779 | 0 | 0.594658 | 0.829975 | 0.431569 | 0.092018 | $Ce_{0.026}Ca_{0.794}Al_{0.82}Si_{1.18}N_{2.82}O_{0.18}$ |
| | II-5 | 0.019934 | 0 | 0.709703 | 0.676972 | 0.59339 | 0 | $Ce_{0.008}Ca_{0.992}AlSiN_3$ |
| | II-6 | 0.019837 | 0.001435 | 0.705819 | 0.673675 | 0.5905 | 0 | $Ce_{0.008}Eu_{0.0006}Ca_{0.9914}AlSiN_3$ |
| | II-7 | 0.019797 | 0.002386 | 0.704101 | 0.672306 | 0.5893 | 0 | $Ce_{0.008}Eu_{0.001}Ca_{0.991}AlSiN_3$ |
| | II-8 | 0.049593 | 0.001435 | 0.697276 | 0.673675 | 0.5905 | 0 | $Ce_{0.02}Eu_{0.0006}Ca_{0.9794}AlSiN_3$ |
| | II-9 | 0.012398 | 0.001435 | 0.707955 | 0.673675 | 0.5905 | 0 | $Ce_{0.005}Eu_{0.0006}Ca_{0.9944}AlSiN_3$ |
| | II-10 | 0.02045 | 0.012325 | 0.643668 | 0.770888 | 0.497145 | 0.055524 | $Ce_{0.008}Eu_{0.005}Ca_{0.89}Al_{0.89}Si_{1.11}N_{2.89}O_{0.11}$ |
| Comparative | II-1 | 0 | 0.002386 | 0.709784 | 0.672306 | 0.5893 | 0 | $Eu_{0.001}Ca_{0.999}AlSiN_3$ |
| Examples | II-2 | 0 | 0.001435 | 0.711515 | 0.673675 | 0.5905 | 0 | $Eu_{0.0006}Ca_{0.9994}AlSiN_3$ |
| | II-3 | 0 | 0.019229 | 0.709956 | 0.677214 | 0.593602 | 0 | $Eu_{0.008}Ca_{0.992}AlSiN_3$ |

Figure 11:
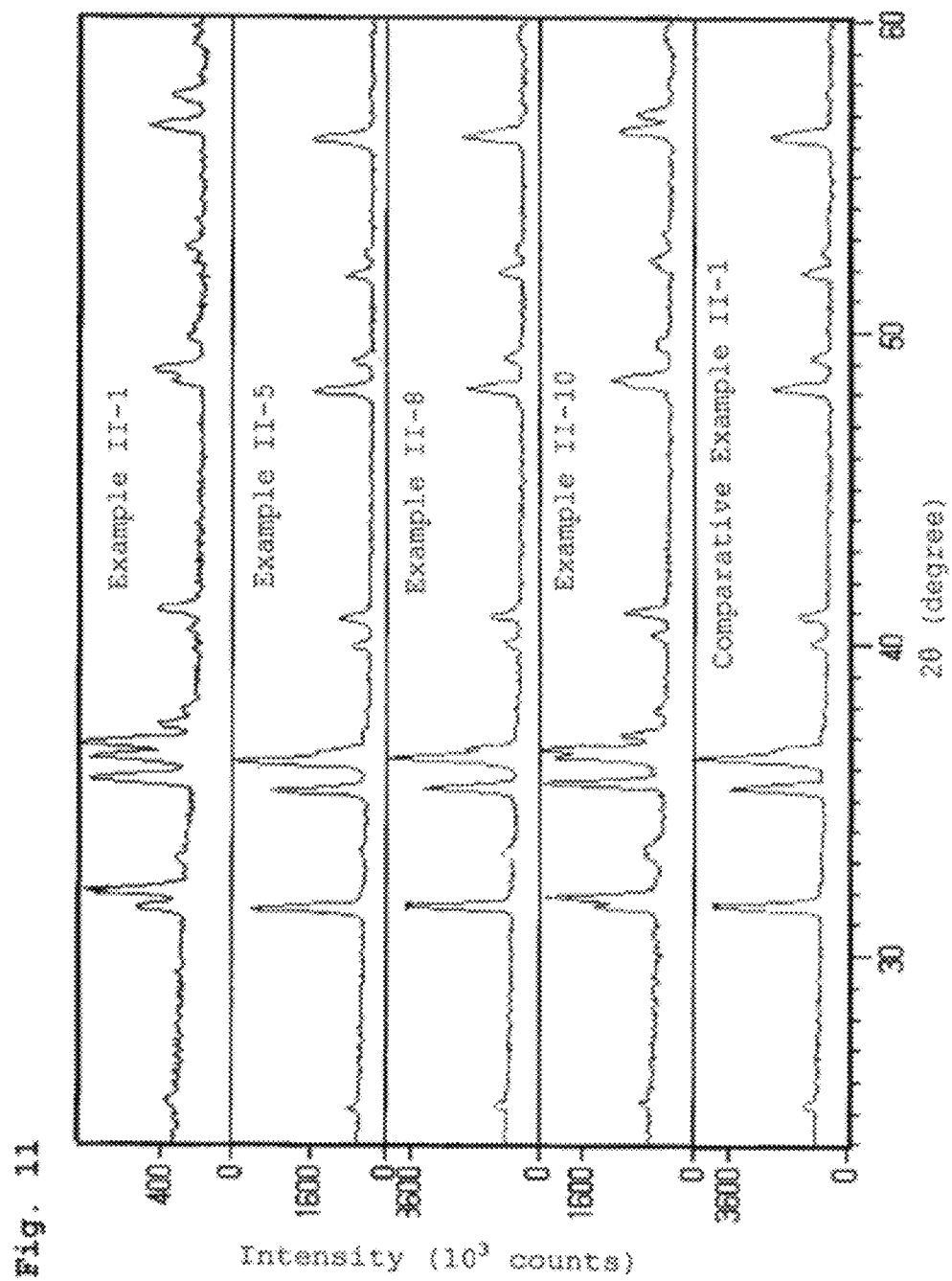
FIG. 11 shows XRD patterns of the phosphors of Examples II-1, 5, 8, and 10, and Comparative Example 1.

FIG. 11 shows the results of X-ray diffraction of the phosphors of Examples II-1, II-5, II-8, II-10, and Comparative Example II-1. FIG. 11 indicates that the crystal maintains the state of the space group $Cmc2_1$ and an orthorhombic system.

In the phosphors obtained in the Examples II-1 to II-4, II-6, II-9, and II-10, the alkaline earth metal elements contained in the phosphors are substituted by elements having a lower valence than the alkaline earth metal elements or vacancies, or the rare-earth metal elements contained in the phosphors are substituted by elements having a lower valence than the rare-earth metal elements or vacancies.

In the phosphors obtained in Examples II-5, II-7, and II-8, the alkaline earth metal elements contained in the phosphors are not substituted by elements having a lower valence than the alkaline earth metal elements or vacancies, or the rare-earth metal elements contained in the phosphors are not substituted by elements having a lower valence than the rare-earth metal elements or vacancies.

Figure 10:
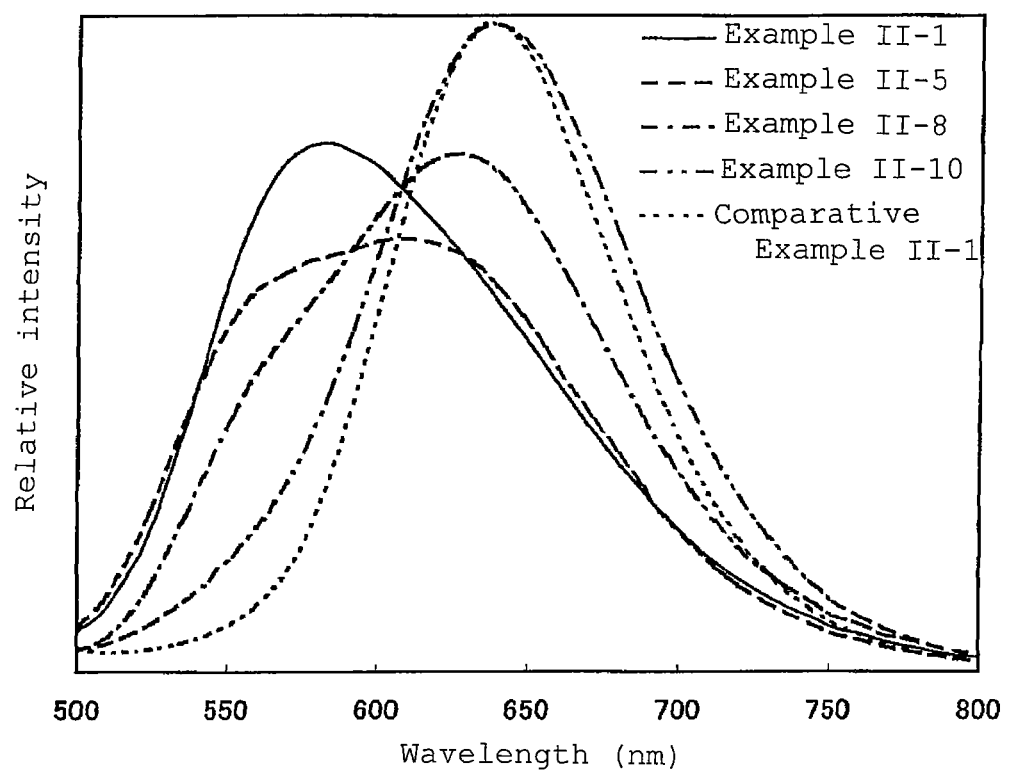
FIG. 10 shows emission spectra of the phosphors of Examples II-1, 5, 8, and 10, and Comparative Example II-1 upon excitation at 465 nm.

The thus obtained phosphors were excited with a lamp emitting light having a wavelength of 465 nm, and the emission spectrum was measured using a fluorescence spectrophotometer. Table 8 lists the emission peak wavelengths and the relative brightness determined taking the luminous brightness of the phosphor of Comparative Example II-1 as 100. FIG. 10 shows the emission spectra of the phosphors obtained in Examples II-1, II-5, II-8, II-10, and Comparative Example II-1 upon excitation at light having the wavelength of 465 nm.

In addition, the ratio of the excitation intensity (peak value in the emission spectrum) at the green light wavelength of 535 nm to the excitation intensity (peak value in the emission spectrum) at the wavelength of 465 nm was determined, and the results are listed in Table 8.

TABLE 8

| | x, y(1 − x), and z(1 − x) in general formula [21] | | | Properties of emission spectrum upon excitation at 465 nm | | Ratio of excitation intensity at the green light wavelength of 535 nm |
| --- | --- | --- | --- | --- | --- | --- |
| Example or Comparative Example | x (proportion of solid-dissolved $Si_2N_2O$) | y(1 − x) (number of Ce moles) | z(1 − x) (number of Eu moles) | Relative brightness | Emission wavelength (nm) | to excitation intensity upon excitation at 465 nm |
| Example II-1 | 0.18 | 0.032 | 0 | 216 | 582 | 81 |
| Example II-2 | 0.18 | 0.04 | 0 | 208 | 587 | 80 |
| Example II-3 | 0.18 | 0.048 | 0 | 200 | 587 | 80 |
| Example II-4 | 0.18 | 0.026 | 0 | 173 | 576 | 61 |
| Example II-5 | 0 | 0.008 | 0 | 191 | 614 | 67 |
| Example II-6 | 0 | 0.008 | 0.0006 | 167 | 627 | 76 |
| Example II-7 | 0 | 0.008 | 0.001 | 156 | 634 | 87 |
| Example II-8 | 0 | 0.02 | 0.0006 | 170 | 626 | 80 |
| Example II-9 | 0 | 0.005 | 0.0006 | 161 | 631 | 80 |
| Example II-10 | 0.11 | 0.008 | 0.005 | 147 | 640 | 79 |
| Comparative Example II-1 | 0 | 0 | 0.001 | 100 | 637 | 100 |
| Comparative Example II-2 | 0 | 0 | 0.0006 | 85 | 635 | 79 |
| Comparative Example II-3 | 0 | 0 | 0.008 | 82 | 649 | 132 |

In the phosphors obtained in Comparative Examples, the alkaline earth metal elements contained in the phosphors are not substituted by elements having a lower valence than the alkaline earth metal elements or vacancies, or the rare-earth metal elements contained in the phosphors are not substituted by elements having a lower valence than the rare-earth metal elements or vacancies.

The above results indicate the following facts.

The results on Example II-5 and Comparative Example II-1, in which the activator is Ce alone and Eu alone, respectively, indicates that the emission wavelength peak shifts toward short wavelength side when Eu is replaced by Ce. Example II-8 containing the both of Ce and Eu exhibited light emission in the wavelength range at about the midpoint between Ce and Eu. From another viewpoint, the results on Examples II-3 and II-4 indicate that the addition of the activator Ce to the host crystal composed of $CaAlSiN_3$ and solid-dissolved $Si_2N_2O$ causes a remarkable shift of the peak wavelength from 576 nm exhibiting red light to 587 nm exhibiting an orange light, and increases the relative brightness. On the other hand, the result on Example II-10 indicates that the addition of Eu to the system decreases the degree of wavelength variations.

The excitation spectra of the phosphors according to the present invention indicate that the ratio of the excitation intensity at the green light wavelength of 535 nm to the excitation intensity at the blue LED wavelength of 465 nm is, except for Comparative Examples II-2 and II-3 having too low brightness, lower for the Ce-containing systems (Examples II-1 to II-10) than the system containing Eu in place of Ce (Comparative Example II-1). This indicates that, in the white optical device composed of the blue LED, green phosphor, and red phosphor, the Ce-containing system scarcely excites the green light from the green phosphor, or scarcely loses the green light.

Examples and Comparative Examples of Phosphors Containing Crystal Phase [31]

The following Examples and Comparative Example used the raw material powders listed below.

Silicon nitride ($Si_3N_4$) powder, average particle diameter: 0.5 μm, oxygen content: 0.93% by weight, α-type content: 92%

Aluminum nitride (AlN) powder, specific surface area: 3.3 $m^2/g$, oxygen content 0.79% by weight Calcium nitride ($Ca_3N_2$) powder Lithium nitride ($Li_3N$) powder Europium nitride (EuN) powder synthesized by nitriding metal europium in ammonia Examples III-1 to III-4, Comparative Examples III-1

In order to obtain compounds having the theoretical composition formulae listed in Table 9, each of the raw material powders listed in Table 9 was taken at the weight (g) listed in Table 9, and mixed for 10 minutes using a pestle and mortar made of agate. Thereafter, the mixture was filled in a boron nitride crucible. All the operations from weighing to mixing the powders were conducted in a glove box capable of keeping a nitrogen atmosphere having a moisture content of 1 ppm or less and an oxygen content of 1 ppm or less.

The powder mixture was placed in a boron nitride crucible, and mounted on an electric furnace of graphite resistance heating type. The firing operation was conducted as follows: the firing atmosphere was vacuumized by a diffusion pump, the temperature was increased from room temperature to 800° C. at a ratio of 500° C. per hour, nitrogen having a purity of 99.999% by volume was introduced at the temperature of 800° C. to raise the pressure to 0.5 Mpa, the temperature was increased to the maximum temperature of 1800° C. at a ratio of 500° C. per hour, and the maximum temperature was maintained for 2 hours. After the firing operation, the fired product was coarsely pulverized, then manually pulverized using a crucible and a mortar made of a silicon nitride sintered body, and thus a phosphor powder was obtained.

The substance obtained by the firing operation has the theoretical chemical formula shown in Table 9. The substance is expressed by the general formula [31], wherein x' and y(1−x') had values listed in Table 10, corresponding to the charged raw materials.

The composition analysis of the obtained substance was conducted as follows.

50 mg of the sample was placed in a platinum crucible, 0.5 g of sodium carbonate and 0.2 g of boric acid were added and thermally fused, and the melt was dissolved in 2 ml of hydrochloric acid to obtain 100 ml of a test solution. The liquid sample was subjected to ICP emission spectral analysis thereby determining the amount of Si, Al, Eu, and Ca in the powder sample. In addition, 20 mg of the sample was placed in a tin capsule, the capsule was placed in a nickel basket, and then subjected to a TC-436 oxygen/nitrogen analyzer manufactured by LECO Corporation thereby determined the amount of oxygen and nitrogen in the powder sample.

Figure 12:
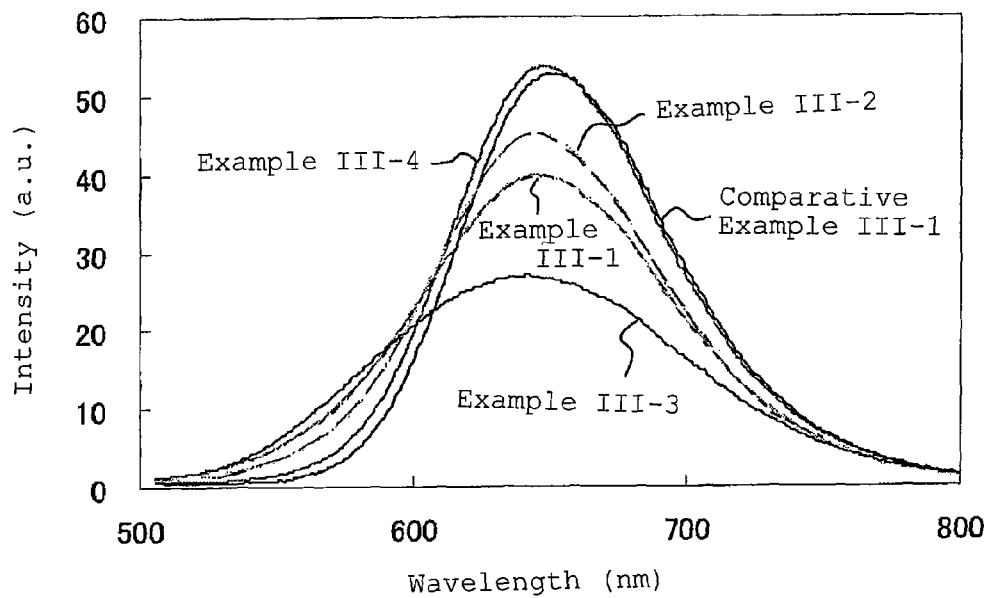
FIG. 12 shows emission spectra of the phosphors of Examples III-1 to III-4 and Comparative Example III-1 upon excitation at 465 nm.

The phosphors were excited with a lamp emitting light having a wavelength of 465 nm, and the emission spectra were measured using a fluorescence spectrophotometer. Table 10 lists the emission peak wavelengths and the relative brightness determined taking the luminous brightness of the phosphor of Comparative Example III-1 as 100. FIG. 12 shows the emission spectra of the phosphors obtained in Examples III-1 to III-4 and Comparative Example III-1 upon excitation at light having the wavelength of 465 nm.

The ratio of the excitation intensity (peak value in the emission spectrum) at the green light wavelength of 535 nm to the excitation intensity (peak value in the emission spectrum) at the wavelength of 465 nm was determined, and the results are listed in Table 10.

Comparative Examples III-2 and III-3

Comparative Examples III-2 and III-3 were conducted in the same manner as Example III-1, except that, in order to examine the effect of boron nitride addition, 2000 ppm and 4000 ppm of boron nitride as an external additive was added to the raw material composition of Comparative Example III-1. The evaluation results are shown in Table 10.

Comparative Examples III-4 and III-5

Comparative Examples III-4 and III-5 were conducted in the same manner as Example III-1, except that, in order to examine the influence of the firing temperature or firing atmosphere, the raw material composition of Comparative Example III-1 was changed to the firing conditions shown in Table 9. The evaluation results are shown in Table 10.

TABLE 9

| Example or Comparative Example | Charged weight of raw materials (g) | | | | | | Firing conditions | | | | Theoretical chemical formula of resultant substance |
|---|---|---|---|---|---|---|---|---|---|---|---|
| | EuN | $Li_3N$ | $Ca_3N_2$ | AlN | $Si_3N_4$ | Gas | Temperature (° C.) | Pressure (MPa) | Time (hr) | Additive | |
| Example III-1 | 0.0201 | 0.0316 | 0.6065 | 0.5080 | 0.8339 | $N_2$ | 1800 | 0.5 | 2 | None | $Eu_{0.008}Ca_{0.812}Li_{0.18}Al_{0.82}Si_{1.18}N_3$ |
| Example III-2 | 0.0197 | 0.0190 | 0.6478 | 0.5422 | 0.7714 | $N_2$ | 1800 | 0.5 | 2 | None | $Eu_{0.008}Ca_{0.882}Li_{0.11}Al_{0.89}Si_{1.11}N_3$ |
| Example III-3 | 0.0208 | 0.0601 | 0.5131 | 0.4307 | 0.9753 | $N_2$ | 1800 | 0.5 | 2 | None | $Eu_{0.008}Ca_{0.662}Li_{0.33}Al_{0.67}Si_{1.33}N_3$ |

TABLE 9-continued

| Example or Comparative Example | Charged weight of raw materials (g) | | | | | | Firing conditions | | | | Theoretical chemical formula of resultant substance |
|---|---|---|---|---|---|---|---|---|---|---|---|
| | EuN | Li$_3$N | Ca$_3$N$_2$ | AlN | Si$_3$N$_4$ | Gas | Temperature (°C.) | Pressure (MPa) | Time (hr) | Additive | |
| Example III-4 | 0.0195 | 0.0085 | 0.6821 | 0.5706 | 0.7194 | N$_2$ | 1800 | 0.5 | 2 | None | Eu$_{0.023}$Ca$_{0.942}$Li$_{0.05}$Al$_{0.95}$Si$_{1.05}$N$_3$ |
| Comparative Example III-1 | 0.0192 | 0.0000 | 0.7100 | 0.5936 | 0.6772 | N$_2$ | 1800 | 0.5 | 2 | None | Eu$_{0.008}$Ca$_{0.992}$Al$_1$Si$_1$N$_3$ |
| Comparative Example III-2 | 0.0192 | 0.0000 | 0.7100 | 0.5936 | 0.6772 | N$_2$ | 1800 | 0.5 | 2 | BN 2000 ppm | — |
| Comparative Example III-3 | 0.0192 | 0.0000 | 0.7100 | 0.5936 | 0.6772 | N$_2$ | 1800 | 0.5 | 2 | BN 4000 ppm | — |
| Comparative Example III-4 | 0.0192 | 0.0000 | 0.7100 | 0.5936 | 0.6772 | N$_2$ | 1600 | 0.1 | 2 | None | Eu$_{0.008}$Ca$_{0.992}$Al$_1$Si$_1$N$_3$ |
| Comparative Example III-5 | 0.0192 | 0.0000 | 0.7100 | 0.5936 | 0.6772 | N$_2$ + 4% H$_2$ | 1600 | 0.1 | 2 | None | Eu$_{0.008}$Ca$_{0.992}$Al$_1$Si$_1$N$_3$ |

TABLE 10

| Example or Comparative Example | x' and y(1 − x') in general formula [31] | | Properties of emission spectrum upon excitation at 465 nm | | | Ratio of excitation intensity at the green light wavelength of 535 nm to excitation intensity at 465 nm |
|---|---|---|---|---|---|---|
| | x' (proportion of solid-dissolved LiSi$_2$N$_3$) | y(1 − x') (number of Eu moles) | Relative brightness | Emission wavelength (nm) | Relative integrated emission intensity | |
| Example III-1 | 0.18 | 0.008 | 139.47 | 648 | 90.64 | 0.68 |
| Example III-2 | 0.11 | 0.008 | 131.32 | 644 | 93.88 | 0.84 |
| Example III-3 | 0.33 | 0.008 | 129.55 | 642 | 72.09 | 0.49 |
| Example III-4 | 0.05 | 0.023 | 117.4 | 649 | 103.61 | 0.84 |
| Comparative Example III-1 | 0 | 0.008 | 100 | 649 | 100 | 0.84 |
| Comparative Example III-2 | 0 | — | 97.3 | 649 | 103.7 | 0.84 |
| Comparative Example III-3 | 0 | — | 99.3 | 649 | 101.4 | 0.84 |
| Comparative Example III-4 | 0 | 0.008 | 84.9 | 650 | 82.3 | — |
| Comparative Example III-5 | 0 | 0.008 | 94.9 | 648 | 87.4 | — |

The results on Examples III-1 to III-4 indicate that the relative brightness increases when x' is greater than 0.

As indicated by the results on Comparative Examples III-2 and III-3, the luminescence properties was not improved by the use of boron nitride as the vessel or the addition of boron nitride to the raw materials.

The results on Comparative Example III-4 and III-5 indicate that the luminescence properties of the phosphors are not remarkably influenced by the firing temperature and the presence or absence of hydrogen in the firing atmosphere.

As shown in Table 3, in the results of X-ray diffraction on the phosphors of Examples III-1, III-3, and Comparative Example III-1, the calculated intensities are in good agreement with the measured values, which indicate that these crystals maintains the state of the space group Cmc2$_1$ and an orthorhombic system.

In the phosphors obtained in Examples III-1 to III-4, the alkaline earth metal elements contained in the phosphors are not substituted by elements having a lower valence than the alkaline earth metal elements or vacancies, or the rare-earth metal elements contained in the phosphors are not substituted by elements having a lower valence than the rare-earth metal elements or vacancies.

In the phosphors obtained in Comparative Examples III-1 to III-5, the alkaline earth metal elements contained in the phosphors are not substituted by elements having a lower valence than the alkaline earth metal elements or vacancies, or the rare-earth metal elements contained in the phosphors are not substituted by elements having a lower valence than the rare-earth metal elements or vacancies.

Examples and Comparative Examples of Phosphors Containing Crystal Phase [1]

In the following Examples and Comparative Example the raw material powders listed below are used.
Lithium nitride (Li$_3$N) powder
(Ca$_{0.2}$Sr$_{0.7925}$Ce$_{0.0075}$)AlSiN$_3$ phosphor synthesized by nitriding through firing (Ca$_{0.2}$Sr$_{0.7925}$Ce$_{0.0075}$)AlSi alloy at 1900° C. in nitrogen atmosphere of 190 Mpa Examples IV-1

In order to obtain compounds having the theoretical composition formula shown below, each of the raw material powders listed in Table 11 was taken at the weight (g) listed in Table 11, and mixed for 10 minutes using a pestle and mortar made of agate. Thereafter, the mixture was filled in a boron nitride crucible (volume filling rate: 38%). All the operations from weighing to mixing the powders were conducted in a glove box capable of keeping a nitrogen atmosphere having a moisture content of 1 ppm or less and an oxygen content of 1 ppm or less.

Theoretical composition formula:

$(Ca_{0.2}Sr_{0.7925}Ce_{0.0075}AlSiN_3)_{0.61}(LiSi_2N_3)_{0.39}$

TABLE 11

| | Charged weight of raw materials (g) | | | Firing temperature |
|---|---|---|---|---|
| | $Ca_{0.2}Sr_{0.7925}Ce_{0.0075}AlSiN_3$ | $Li_3N$ | $Si_3N_4$ | (° C.) |
| Example IV-1 | 1.00 | 0.4325 | 0.1675 | 1250 |

The powder mixture was placed in a boron nitride crucible, and mounted on an electric furnace of graphite resistance heating type. The firing operation was conducted as follows: the firing atmosphere was vacuumized by a diffusion pump, the temperature was increased from room temperature to 800° C. at a ratio of 1200° C. per hour, nitrogen having a purity of 99.999% by volume was introduced at the temperature of 800° C. to raise the pressure to 0.992 Mpa, the temperature was increased to the firing temperature listed in Table 11 at a ratio of 1250° C. per hour, and the firing temperature listed in Table 11 was maintained for 4 hours. After the firing operation, the fired product was washed with water to remove residual excessive $Li_3N$ therefrom, and the fired product was coarsely pulverized, then manually pulverized using a crucible and a mortar made of an alumina sintered body, and thus a phosphor powder was obtained.

Figure 13:
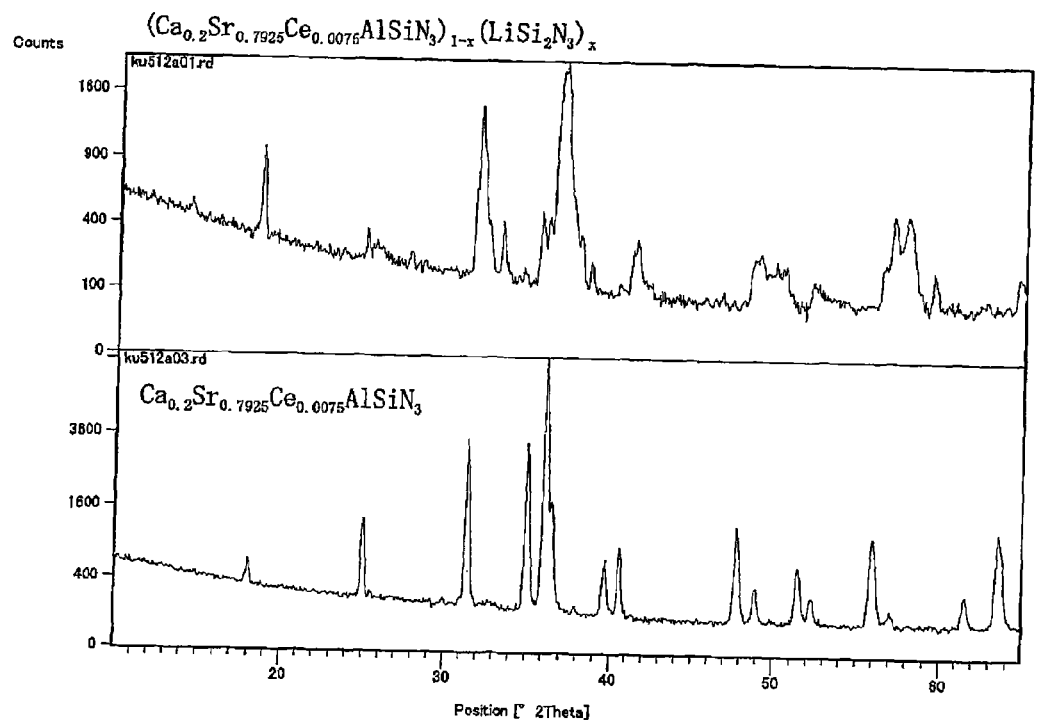
FIG. 13 shows XRD patterns of the phosphors of Example IV-1, $(Ca_{0.2}Sr_{0.7925}Ce_{0.0075}AlSiN_3)_{1-x}(LiSi_2N_3)_x$ and $Ca_{0.2}Sr_{0.7925}Ce_{0.0075}AlSiN_3$.

The XRD pattern of the phosphor powder is shown in FIG. 13.

For comparison, the XRD pattern of $Ca_{0.2}Sr_{0.7925}Ce_{0.0075}AlSiN_3$ is also shown in FIG. 13. FIG. 13 indicates that: the calculated value of 2θ, which is determined from the plane indices in consideration of the shifts of the lattice constants, is in approximate agreement with the observed value; the crystal maintains the space group $Cmc2_1$, or an orthorhombic system; and a solid solution having a $CaAlSiN_3$ structure related to $(Ca_{0.2}Sr_{0.7925}Ce_{0.0075}AlSiN_3)_{1-x}(LiSi_2N_3)_x$ is formed. The comparison of the XRD patterns shown in FIG. 13 indicates that all the peaks of $(Ca_{0.2}Sr_{0.7925}Ce_{0.0075}AlSiN_3)_{1-x}(LiSi_2N_3)_x$ are at higher angles than those of $Ca_{0.2}Sr_{0.7925}Ce_{0.0075}AlSiN_3$.

Figure 14:
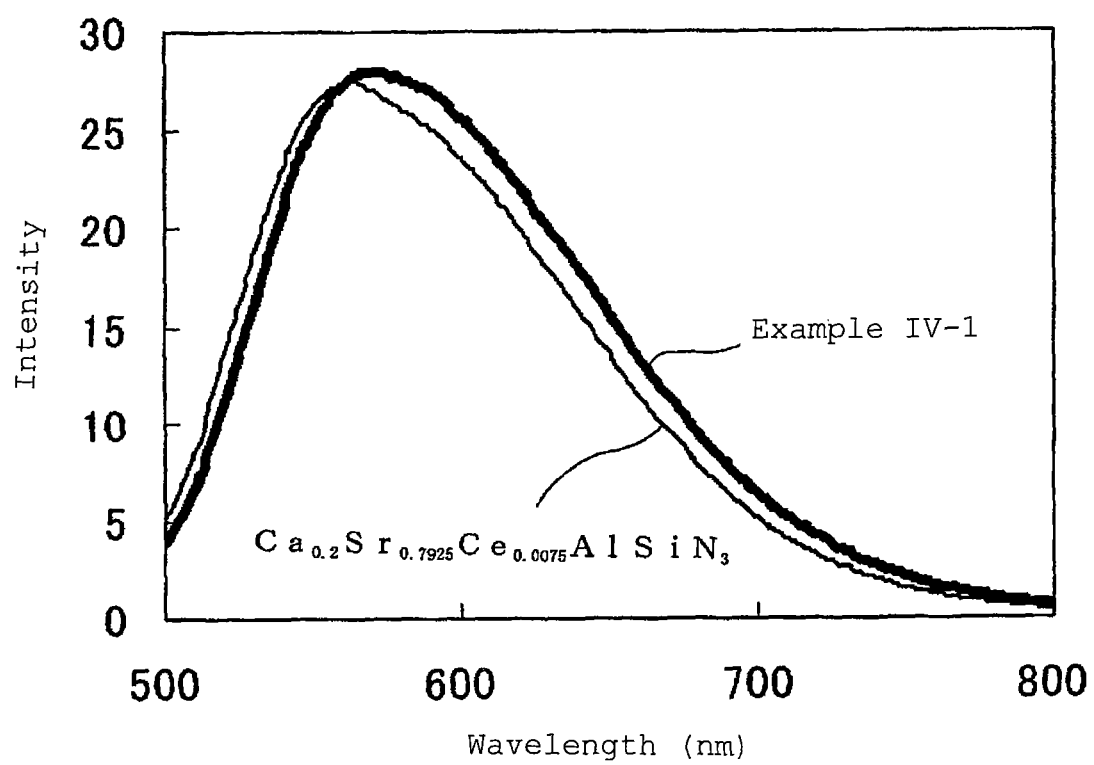
FIG. 14 shows emission spectra of the phosphors of Example IV-1, $(Ca_{0.2}Sr_{0.7925}Ce_{0.0075}AlSiN_3)_{1-x}(LiSi_2N_3)_x$ and $Ca_{0.2}Sr_{0.7925}Ce_{0.0075}AlSiN_3$, upon excitation with light having a wavelength of 455 nm.

FIG. 14 shows the emission spectra of the phosphor upon excitation at light having the wavelength of 465 nm. FIG. 14 indicates that $(Ca_{0.2}Sr_{0.7925}Ce_{0.0075}AlSiN_3)_{1-x}(LiSi_2N_3)_x$ exhibits a higher emission intensity than that of $Ca_{0.2}Sr_{0.7925}Ce_{0.0075}AlSiN_3$.

In the phosphor obtained in Example IV-1, the alkaline earth metal elements contained in the phosphors are substituted by elements having a lower valence than the alkaline earth metal elements or vacancies, or the rare-earth metal elements contained in the phosphors are substituted by elements having a lower valence than the rare-earth metal elements or vacancies.

The phosphor of the present invention emits light having higher brightness than those emitted from existing nitride or oxynitride phosphors, serves as an excellent orange or red phosphor. In addition, the phosphor decreases in its brightness when exposed to an excitation source, and has excellent durability. Therefore, the phosphor is suitable to white light emitting devices, lighting systems, VFDs, FEDs, PDPs, and CRTs. In addition, the phosphor of the present invention is readily adjustable for the emission wavelength and emission peak width, so that it has a wide range of industrial applicability, and is expected to widely used in material design of various light emitting devices, lighting systems, and displays to contribute industrial development.

The present invention has been described in detail with reference to specific embodiments, but it will be evident to those skilled in the art that various modifications can be made without departing from the spirit and scope of the present invention.

The present application is based on Japanese Patent Application submitted on May 24, 2005 (Japanese Patent Application No. 2005-151183), Japanese Patent Application submitted on May 25, 2005 (Japanese Patent Application No. 2005-152637), Japanese Patent Application submitted on Aug. 10, 2005 (Japanese Patent Application No. 2005-231870), and Japanese Patent Application submitted on Feb. 2, 2006 (Japanese Patent Application No. 2006-25994), and the entirety thereof is incorporated by reference.

The invention claimed is:

1. A phosphor comprising a crystal phase having a chemical composition expressed by the general formula [31]:

$$(Eu_yM^{II}_{1-y}M^{III}M^{IV}N_3)_{1-x'}(AM^{IV}_2N_3)_{x'} \quad [31]$$

wherein in the general formula [31], $M^{II}$ represents divalent metal elements including Mg, Ca, Sr, Ba, and Zn at a ratio of 90 mol % or more in total; $M^{III}$ represents trivalent metal elements including Al at a ratio of 80 mol % or more; $M^{IV}$ represents tetravalent metal elements including Si at a ratio of 90 mol % or more; A represents one or more metal elements selected from Li, Na, and K; x' satisfies 0<x'<1.0; y satisfies 0<y 0.2.

2. The phosphor according to claim 1, wherein in the general formula [31], $M^{II}$ includes Ca and Sr at a ratio of 80 mol % or more in total.

3. The phosphor according to claim 1, wherein in the general formula [31], $M^{II}$ is Ca, $M^{III}$ is Al, and $M^{IV}$ is Si.

4. A light emitting device comprising a first illuminant which emits light having a wavelength of 330 nm to 500 nm, and a second illuminant which emits visible light upon irradiation with light from the first illuminant, wherein the second illuminant contains the phosphor according to claims 1.

5. The light emitting device according to claim 4, wherein the first illuminant is a laser diode or light emitting diode.

6. The light emitting device according to claim 5, wherein the first illuminant is a light emitting diode which emits light having a wavelength of 330 nm to 420 nm, and the second illuminant is composed of the phosphor, which emits red light, a blue phosphor which emits fluorescence exhibiting an emission peak in the wavelength from 420 nm to 500 nm upon excitation with light having a wavelength of 330 nm to 420 nm, and a green phosphor which emits fluorescence exhibiting an emission peak in the wavelength from 500 nm to 570 nm upon excitation with light having a wavelength of 330 nm to 420 nm, and the red, green, and blue light are mixed thereby producing white light.

7. The light emitting device according to claim 5, wherein the first illuminant is a light emitting diode which emits light having a wavelength of 420 nm to 500 nm, and the blue light emitted from the light emitting diode is mixed with light emitted from the phosphor upon excitation with a light from the first illuminant thereby producing white light.

8. The light emitting device according to claim 5, wherein the first illuminant is a light emitting diode which emits light having a wavelength of 420 nm to 500 nm, the second illuminant is composed of the phosphor, and a green phosphor which emits fluorescence exhibiting an emission peak in the wavelength from 500 nm to 570 nm upon excitation with light having a wavelength of 420 nm to 500 nm, and thus the light emitting device emits a white light.

9. The light emitting device according to claim 5, wherein the first illuminant is a light emitting diode which emits light having a wavelength of 420 nm to 500 nm, the second illuminant is composed of the phosphor, and a yellow phosphor which emits fluorescence exhibiting an emission peak in the wavelength from 550 nm to 600 nm upon excitation with light having a wavelength of 420 nm to 500 nm, and thus the light emitting device emits a white light.

10. A lighting system comprising the light emitting device according to claim 4.

11. A display having an excitation source and a phosphor, wherein the phosphor includes at least the phosphor according to claims 1.

12. A display comprising the light emitting device according to claim 4.

\* \* \* \* \*